United States Patent
Yamazaki et al.

(10) Patent No.: US 10,062,790 B2
(45) Date of Patent: Aug. 28, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yuta Endo, Kanagawa (JP); Yoko Tsukamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/823,680

(22) Filed: Nov. 28, 2017

(65) Prior Publication Data

US 2018/0090618 A1 Mar. 29, 2018

Related U.S. Application Data

(63) Continuation of application No. 15/081,129, filed on Mar. 25, 2016, now Pat. No. 9,837,546.

(30) Foreign Application Priority Data

Mar. 27, 2015 (JP) .................................. 2015-066832

(51) Int. Cl.
*H01L 29/12* (2006.01)
*H01L 21/36* (2006.01)
(Continued)

(52) U.S. Cl.
CPC .... *H01L 29/7869* (2013.01); *H01L 29/42392* (2013.01); *H01L 29/78696* (2013.01)

(58) Field of Classification Search
CPC ......... H01L 29/66765; H01L 29/78636; H01L 29/7869; H01L 29/78696; H01L 29/78648;
(Continued)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Colinge.J et al., "Silicon-on-Insulator "Gate-All-Around Device"", IEDM 90: Technical Digest of International Electron Devices Meeting, Dec. 9, 1990, pp. 595-598.

(Continued)

*Primary Examiner* — Kimberly Rizkallah
*Assistant Examiner* — Brian Turner
(74) *Attorney, Agent, or Firm* — Fish & Richardson P.C.

(57) ABSTRACT

To provide a miniaturized transistor having highly stable electrical characteristics. Furthermore, also in a semiconductor device including the transistor, high performance and high reliability are achieved. The transistor includes, over a substrate, a conductor, an oxide semiconductor, and an insulator. The oxide semiconductor includes a first region and a second region. The resistance of the second region is lower than that of the first region. The entire surface of the first region in the oxide semiconductor is surrounded in all directions by the conductor with the insulator interposed therebetween.

18 Claims, 48 Drawing Sheets

(51) Int. Cl.
   *H01L 29/10* (2006.01)
   *H01L 21/84* (2006.01)
   *H01L 31/036* (2006.01)
   *H01L 31/0376* (2006.01)
   *H01L 29/786* (2006.01)
   *H01L 29/423* (2006.01)

(58) Field of Classification Search
   CPC .............. H01L 29/4908; H01L 27/124; H01L 27/1248; H01L 27/1255; H01L 27/1225; H01L 21/02532; H01L 21/02683
   See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,274,079 B2 | 9/2012 | Yamazaki |
| 8,547,771 B2 | 10/2013 | Koyama |
| 8,674,354 B2 | 3/2014 | Yamazaki |
| 8,878,180 B2 | 11/2014 | Yamazaki |
| 8,962,457 B2 | 2/2015 | Watanabe |
| 9,202,923 B2 | 12/2015 | Yamazaki |
| 9,680,026 B2 | 6/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0158929 A1 | 7/2005 | Yamazaki et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0078633 A1 | 4/2010 | Watanabe |
| 2010/0092800 A1 | 4/2010 | Itagaki et al. |
| 2010/0109002 A1 | 5/2010 | Itagaki et al. |
| 2010/0237354 A1 | 9/2010 | Yamamoto et al. |
| 2010/0273285 A1 | 10/2010 | Wang et al. |
| 2011/0193077 A1 | 8/2011 | Yamazaki |
| 2012/0032730 A1 | 2/2012 | Koyama |
| 2013/0092925 A1 | 4/2013 | Saito et al. |
| 2013/0264563 A1 | 10/2013 | Okazaki et al. |
| 2015/0008428 A1* | 1/2015 | Yamamoto ......... H01L 29/7869 257/43 |
| 2016/0035897 A1* | 2/2016 | Kobayashi ......... H01L 29/7869 257/43 |
| 2016/0071889 A1 | 3/2016 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-283046 A | 11/2008 |
| JP | 2012-059860 A | 3/2012 |

(56) References Cited

FOREIGN PATENT DOCUMENTS

| JP | 2012-257187 A | 12/2012 |
|---|---|---|
| JP | 5215589 | 6/2013 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 33, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol.87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B): 2008, vol. 77, pp. 245262-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide SEMICONDUCTOR", IDW '08 : Proceedings of The 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

521

523

522

527

FIG. 43A1
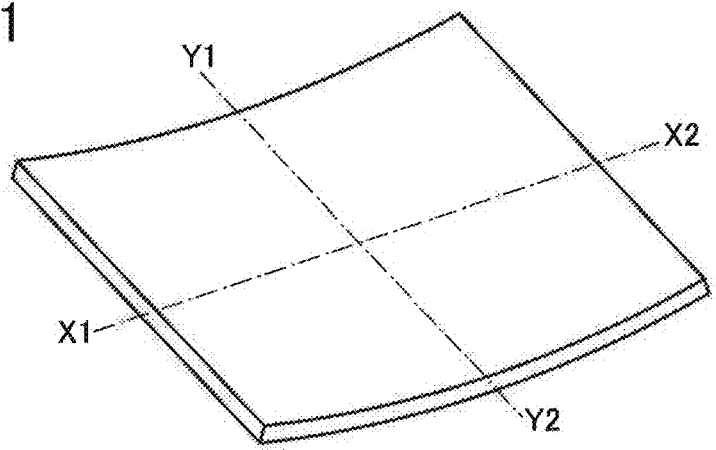
FIG. 43A2 
FIG. 43A3 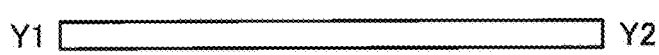
FIG. 43B1
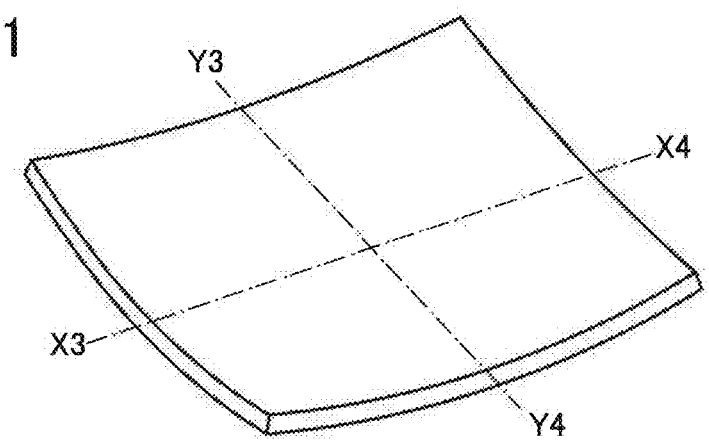
FIG. 43B2 
FIG. 43B3 

SEMICONDUCTOR DEVICE AND ELECTRONIC DEVICE

CROSS-REFERENCE TO RELATED APPLICATIONS

This application is a continuation of U.S. application Ser. No. 15/081,129, filed Mar. 25, 2016, now allowed, which claims the benefit of a foreign priority application filed in Japan as Serial No. 2015-066832 on Mar. 27, 2015, both of which are incorporated by reference.

BACKGROUND OF THE INVENTION

1. Field of the Invention

The present invention relates to, for example, an oxide, a transistor, a semiconductor device, and manufacturing methods thereof. The present invention relates to, for example, an oxide, a display device, a light-emitting device, a lighting device, a power storage device, a memory device, a processor, an imaging device, or an electronic device. The present invention relates to a method for manufacturing an oxide, a display device, a liquid crystal display device, a light-emitting device, a memory device, a processor, an imaging device, or an electronic device. The present invention relates to a driving method of a semiconductor device, a display device, a liquid crystal display device, a light-emitting device, a memory device, a processor, an imaging device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. On the other hand, in the case of a transistor included in a high-performance display device where driver circuits are formed over the same substrate, it is preferred to use polycrystalline silicon, which can form a transistor having high field-effect mobility. As a method for forming polycrystalline silicon, high-temperature heat treatment or laser light treatment which is performed on amorphous silicon has been known.

In recent years, transistors using oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

In addition, a transistor including an amorphous oxide semiconductor is disclosed (see Patent Document 3). An oxide semiconductor can be formed by a sputtering method or the like, and thus can be used for a semiconductor of a transistor in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing the small leakage current characteristic of a transistor including an oxide semiconductor is disclosed (see Patent Document 4). It is also disclosed that a transistor having a high field-effect mobility can be obtained by a well potential formed using an active layer including an oxide semiconductor (see Patent Document 5).

REFERENCE

Patent Document

[Patent Document 1] Japanese Published Patent Application No. S63-239117
[Patent Document 2] Japanese translation of PCT international application No. H11-505377
[Patent Document 3] Japanese Patent No. 5215589
[Patent Document 4] Japanese Published Patent Application No. 2012-257187
[Patent Document 5] Japanese Published Patent Application No. 2012-59860

SUMMARY OF THE INVENTION

When a transistor is miniaturized, a short-channel effect occurs. The short channel effect refers to degradation of electric characteristics of a transistor due to a reduction in channel length (L). One of the short-channel effects occurs when a drain electric field reaches a source. By the short-channel effect, a transistor becomes normally-on, and the subthreshold swing value (also referred to as the S value) and the leakage current of a transistor are increased, for example.

An object of one embodiment of the present invention is to provide a transistor having improved operation characteristics. Another object of one embodiment of the present invention is to provide a semiconductor device with low power consumption. Another object of one embodiment of the present invention is to provide a transistor that can be miniaturized and highly integrated and has stable electrical characteristics. Another object of one embodiment of the present invention is to provide a transistor with small parasitic capacitance.

Another object is to provide a transistor with stable electrical characteristics. Another object is to provide a transistor having a low leakage current in an off state. Another object is to provide a transistor whose amount of on-state current is large. Another object is to provide a transistor having normally-off electrical characteristics. Another object is to provide a transistor having a small subthreshold swing value. Another object is to provide a transistor having high reliability.

Another object is to achieve high performance, high reliability, and high productivity also of a semiconductor device including the transistor. Another object is to provide a semiconductor device to which oxygen is easily supplied to a channel layer of a transistor. Another object is to provide a novel semiconductor device. Note that the descriptions of these objects do not disturb the existence of other objects. Note that one embodiment of the present invention does not necessarily achieve all the objects listed above. Other objects will be apparent from and can be derived from the description of the specification, the drawings, the claims, and the like.

One embodiment of the present invention is a semiconductor device. The semiconductor device includes, over a substrate, a conductor, an oxide semiconductor, and an insulator. The oxide semiconductor includes a first region and a second region. The first region in the oxide semiconductor is surrounded in four directions by the conductor with the insulator interposed therebetween.

Another embodiment of the present invention is a semiconductor device. The semiconductor device includes, over a substrate, a conductor, an oxide semiconductor, a first insulator, and a second insulator. The oxide semiconductor includes a first region and a second region. The second region has lower resistance than the first region. The first region in the oxide semiconductor is surrounded in four directions by the conductor with the first insulator and the second insulator interposed therebetween.

In any of the above embodiments, the impurity concentration may be higher in the second region than in the first region.

Another embodiment of the present invention is a semiconductor device. The semiconductor device includes, over a substrate, a conductor, an oxide semiconductor, and an insulator. The oxide semiconductor includes a first region, a second region, and a third region between the first region and the second region. The third region in the oxide semiconductor is surrounded in four directions by the conductor with the insulator interposed therebetween.

Another embodiment of the present invention is a semiconductor device. The semiconductor device includes, over a substrate, a conductor, an oxide semiconductor, a first insulator, and a second insulator. The oxide semiconductor includes a first region, a second region, and a third region between the first region and the second region. The third region in the oxide semiconductor is surrounded in four directions by the conductor with the first insulator and the second insulator interposed therebetween.

In any of the above embodiments, the impurity concentration may be higher in the first region and the second region than in the third region.

In any of the above embodiments, the first region may serve as one of a source region and a drain region, and the second region may serve as the other of the source region and the drain region.

In any of the above embodiments, the first insulator may include silicon, and the second insulator may include hafnium.

In any of the above embodiments, the thickness of the first insulator may be different from that of the second insulator.

Another embodiment of the present invention is an electronic device including any of the semiconductor devices in the above embodiments.

A transistor can have favorable driving characteristics because of its high on-state current and low off-state current. Furthermore, low power consumption can be realized. In addition, a miniaturized transistor having highly stable electrical characteristics can be provided. Moreover, the channel length can be controlled easily, and thus a short-channel effect can be suppressed even in a miniaturized transistor. Therefore, the integration degree of transistors can be increased, so that a variety of small-sized electronic devices can be further downsized.

A transistor with stable electrical characteristics can be provided. A transistor having a low leakage current in an off state can be provided. A transistor having high on-state current can be provided. A transistor having normally-off electrical characteristics can be provided. A transistor having a small subthreshold swing value can be provided. A transistor having high reliability can be provided.

Furthermore, also in a semiconductor device including the transistor, high performance, high reliability, and high productivity can be achieved. Alternatively, a novel semiconductor device can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 43A1, 43A2, 43A3, 43B1, 43B2, and 43B3 are perspective views and cross-sectional views illustrating semiconductor devices of embodiments of the present invention.

DETAILED DESCRIPTION OF THE INVENTION

Figure 1A:
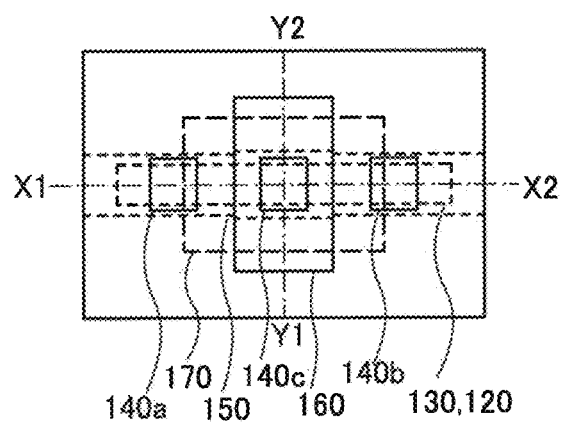
FIGS. 1A to 1C are a top view and cross-sectional views illustrating one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. A term "perpendicular" indicates that an angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions that are just examples. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, an embodiment of a semiconductor device will be described with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, and FIGS. 22A to 22C.

STRUCTURAL EXAMPLE 1 OF SEMICONDUCTOR DEVICE

Figure 1B:
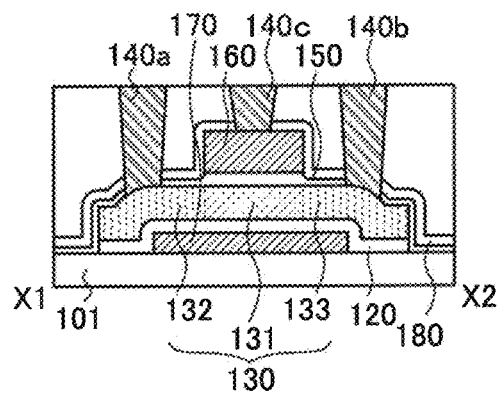
Figure 1C:
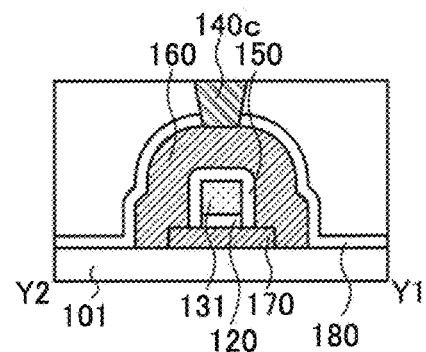

FIGS. 1A to 1C illustrate an example of a transistor 100. For simplicity, some films are not illustrated in FIG. 1A. FIG. 1B is a cross-sectional view taken along dashed-dotted line X1-X2 in FIG. 1A, and FIG. 1C is a cross-sectional view taken along dashed-dotted line Y1-Y2 in FIG. 1A.

The transistor 100 formed over a substrate 101 includes a conductor 160 and a conductor 170 each serving as a gate electrode; an oxide 130 including a region 131, a region 132 serving as one of a source region and a drain region, and a region 133 serving as the other of the source region and the drain region; and an insulator 120 and an insulator 150 each serving as a gate insulating layer. The region 132, the region 133, and the conductor 160 are electrically connected to a wiring 140a, a wiring 140b, and a wiring 140c, respectively.

In a structure of the transistor 100 illustrated in FIGS. 1A to 1C, the regions 131, 132, and 133 are formed in the oxide 130. The impurity concentration is higher in the regions 132 and 133 than in the region 131, and the resistances of the regions 132 and 133 are reduced. For example, the impurity concentration in the region 131 is 5% or less, 2% or less, or 1% or less, of the maximum impurity concentration in the regions 132 and 133. Note that the term "impurity" can be replaced with the term "donor", "acceptor", "dopant", or "element".

As illustrated in FIG. 1B, in the oxide 130, the region 131 includes a region overlapping with the conductor 160, and the regions 132 and 133 are regions excluding the region 131. Note that the regions 132 and 133 may be formed in part of a region where the oxide 130 and the conductor 160 overlap with each other. Thus, in the transistor 100, a region where a channel is formed is in contact with the regions 132 and 133 with low resistance, and high-resistance offset regions are not formed between the regions 132 and 133 and the region where a channel is formed, and accordingly, on-state current of the transistor 100 can be increased.

Note that the regions 132 and 133 may be formed by an ion doping treatment such as an ion implantation method. For example, in the case of the transistor structure in FIG. 1B, the conductor 160 is formed, and then a doping treatment is performed using the conductor 160 as a mask. When the insulator 150 is sufficiently thin and a doping ion is accelerated sufficiently, the impurity penetrates the insulator 150 and is added to the oxide 130. The impurity is not added to the region overlapping with the conductor 160. Accordingly, as illustrated in FIG. 1B, the regions 132 and 133 are formed. Therefore, the impurity concentration measured by SIMS is higher in the regions 132 and 133 than in the region 131.

Examples of an impurity added to the regions 132 and 133 include hydrogen, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because they can be added relatively easily by an ion implantation method, an ion doping method, a plasma immersion ion implantation method, or the like.

Note that many oxygen vacancies are formed in the regions 132 and 133, and therefore, the oxygen concentration measured by SIMS is lower in the regions 132 and 133 than in the region 131. In addition, many defects are formed in the regions 132 and 133, and therefore, the crystallinity of the regions 132 and 133 is lower than that of the region 131.

In FIG. 1C, the transistor 100 has a structure in which an entire surface of the region 131 in the oxide 130 is surrounded by the conductors 160 and 170 with the insulators 120 and 150 interposed therebetween. Note that an "entire surface of the region 131 in the oxide 130" includes top, bottom, and side surfaces of the region 131 in the oxide 130, which are in contact with the insulator 120 and 150. In the case where the region 131 in the oxide 130 is formed with a curved surface where a side surface, a top surface, and a bottom surface thereof are not clearly distinguished from one another, an "entire surface of the region 131 in the oxide 130" means an outermost surface of the region 131 in the oxide 130.

The entire surface of the region 131 in the oxide 130 is surrounded by the conductors with the insulators 120 and 150 interposed therebetween, whereby the region 131 where a channel is formed can be electrically surrounded in four directions (in other words, the four directions of the region 131 except for the channel length direction) by an electric field from the conductors 160 and 170 (a structure of a transistor in which a semiconductor is electrically surrounded by an electric field from a conductor is referred to as a surrounded channel (s-channel) structure). Therefore, a channel is formed in the entire region 131 in some cases. In a s-channel structure, a large amount of current can flow between a source and a drain of a transistor, and thus on-state current can be increased. Furthermore, a voltage is applied from all directions to a region where a channel is formed, and thus, a transistor in which leakage current is suppressed can be provided.

Note that in the case where the transistor has a s-channel structure, a channel is formed in the entire surface of the region 131 in some cases. Therefore, as the oxide 130 has a larger thickness, a channel region becomes larger. In other words, the thicker the oxide 130 is, the larger the on-state current of the transistor is. In addition, when the oxide 130 is thicker, the proportion of the region with a high carrier controllability increases, leading to a smaller subthreshold swing value. The oxide 130 has a region with a thickness of greater than or equal to 10 nm, preferably greater than or equal to 20 nm, further preferably greater than or equal to 30 nm, and still further preferably greater than or equal to 50 nm, for example. Note that the oxide 130 has a region with a thickness of, for example, less than or equal to 300 nm, preferably less than or equal to 200 nm, and further preferably less than or equal to 150 nm because the productivity of the semiconductor device might be decreased.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, and still further preferably less than or equal to 20 nm, and the channel width of the transistor is preferably less than or equal to 40 nm, further preferably less than or equal to 30 nm, and still further preferably less than or equal to 20 nm.

The conductors 160 and 170 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, a stacked structure of the above conductive material and the above metal material can be employed.

Each of the insulators 120 and 150 is preferably an insulator containing oxygen, such as a silicon oxide film or a silicon oxynitride film. Note that as the insulator 120, an insulator containing excessive oxygen (containing oxygen in excess of stoichiometric composition) is preferably used. When such an insulator containing excess oxygen is provided in contact with the oxide 130, oxygen vacancies in the region 131 are compensated.

As each of the insulators 120 and 150, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen and hydrogen, can be used. The insulators 120 and 150 formed of such a material each serve as a layer which prevents release of oxygen from the oxide 130 and entry of an impurity such as hydrogen from the outside.

Note that the insulators 120 and 150 are not necessarily formed of the same material. In the case where the insulators 120 and 150 are formed of different materials, an optimal structure obtained in such a manner that the insulators 120 and 150 have different thicknesses, for example, may be employed as appropriate in consideration of a physical property such as a dielectric constant. For example, a hafnium oxide-based material has a higher dielectric constant than a silicon oxide-based material. Accordingly, in the case where a silicon oxide film is used for the insulator 120 and a hafnium oxide film is used for the insulator 150, the insulator 150 preferably has a larger thickness than the insulator 120. The thicknesses of the insulators 120 and 150 are preferably optimized in consideration of physical properties of materials used for the insulators 120 and 150 so that in the transistor, a channel is formed uniformly in the entire surface of the region 131 in the oxide 130.

The insulators 120 and 150 may each have a stacked-layer structure. For example, an insulating film containing excess oxygen is provided in contact with the oxide 130 and covered by a barrier film, whereby the composition of the oxide 130 can be almost the same as the stoichiometric composition or can be in a supersaturated state containing more oxygen than the stoichiometric composition. It is also possible to prevent entry of impurities such as hydrogen into the oxide 130.

Note that in the case where a silicon oxide film is used for the insulator 150, a surface of the insulator 150 may be etched in forming a conductor to be a gate as illustrated in FIG. 1B. In the case where an impurity is added through the insulator 150 in order to form the regions 132 and 133, the insulator 150 is made thin over the regions 132 and 133, whereby the impurity can be added efficiently. In the case where a hafnium oxide film or the like is used for the insulator 150, the surface of the insulator 150 is not removed in forming the conductor to be a gate.

An oxide forming the region 131 has a wide energy gap of 3.0 eV or more. A transistor including an oxide film obtained by processing of the oxide in appropriate conditions and a sufficient reduction in carrier density of the oxide can have much lower leakage current between a source and a drain in an off state (off-state current) than a conventional transistor including silicon.

An applicable oxide preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

Note that an oxide that can be used as the oxide 130 will be described in detail in Embodiment 2.

In the semiconductor device illustrated in FIG. 1A, an interlayer film is provided so as to cover the transistor 100. An insulator 180 or the like may be stacked as a barrier layer in addition to the interlayer film. A base film may be formed over the substrate 101. In addition to the base film, a barrier film may be stacked.

As the barrier film, an insulator having barrier properties against oxygen and hydrogen is preferably used. For such an insulator, aluminum oxide, aluminum oxynitride, gallium oxide, gallium oxynitride, yttrium oxide, yttrium oxynitride, hafnium oxide, hafnium oxynitride, silicon nitride, or the like can be used. When such a material is used, the barrier film has a function of suppressing release of oxygen from the oxide 130 and diffusion of oxygen to portions other than the oxide 130 from the insulator 120, and also have a function of preventing entry of impurities such as hydrogen from the outside.

The above-described structure makes it possible to provide a transistor with stable electric characteristics. A transistor having a low leakage current in an off state can be provided. A transistor having high on-state current can be provided. A transistor having normally-off electrical characteristics can be provided. A transistor having a small subthreshold swing value can be provided. A transistor having high reliability can be provided.

As described above, since on-state current is high and off-state current is low, the transistor can have favorable driving characteristics. Furthermore, low power consumption can be realized. Even when a channel length becomes short with miniaturization of a transistor, the transistor can have highly stable electrical characteristics. That is, it is presumed that a short-channel effect can be suppressed, miniaturization can be achieved, and the integration degree of transistors can be increased, whereby a variety of small-sized electronic devices can be further downsized. Furthermore, a miniaturized transistor having highly stable electrical characteristics can be provided.

STRUCTURAL EXAMPLE 2 OF SEMICONDUCTOR DEVICE

Figure 2A:
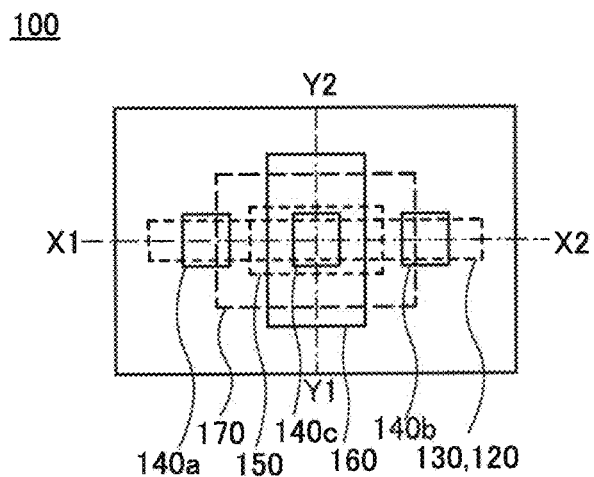
FIGS. 2A to 2C are a top view and cross-sectional views illustrating one embodiment of a semiconductor device.
Figure 2B:
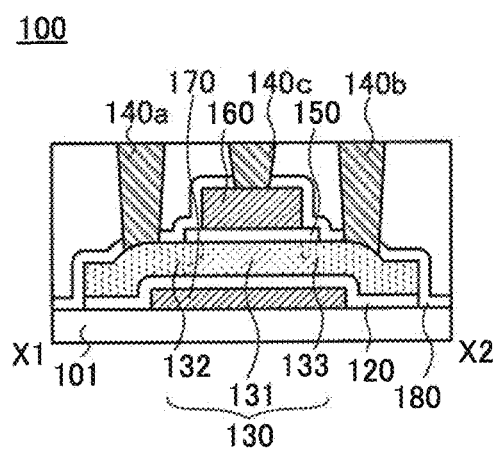
Figure 2C:
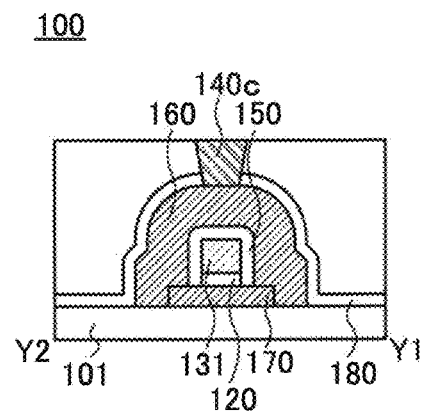
Figure 3A:
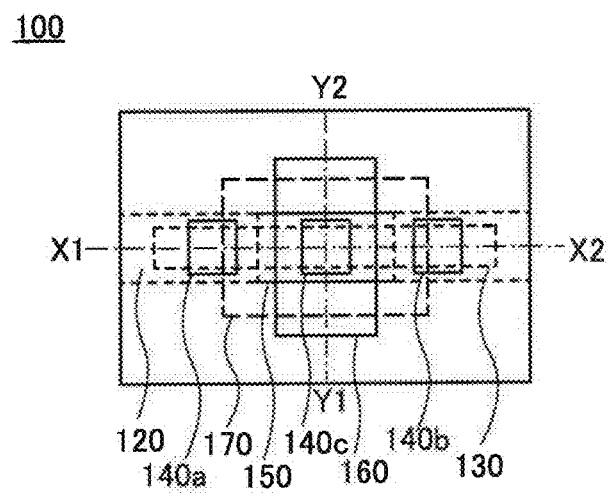
FIGS. 3A to 3C are a top view and cross-sectional views illustrating one embodiment of a semiconductor device.
Figure 3B:
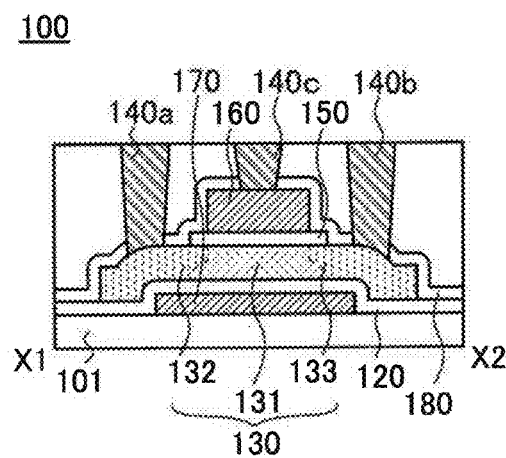
Figure 3C:
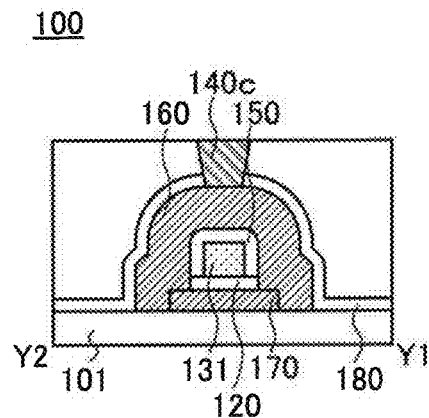
Figure 4A:
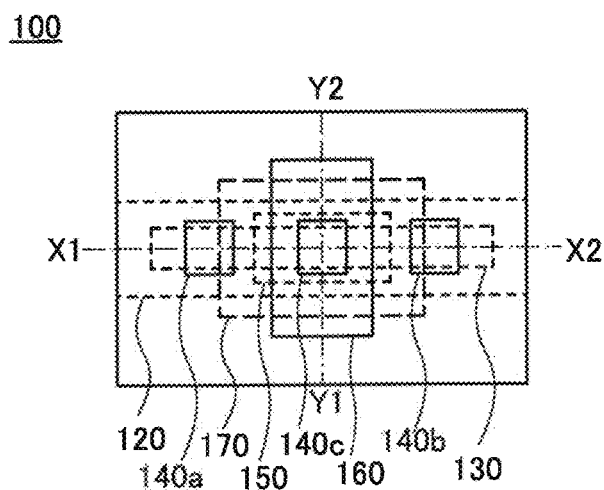
FIGS. 4A to 4C are a top view and cross-sectional views illustrating one embodiment of a semiconductor device.
Figure 4B:
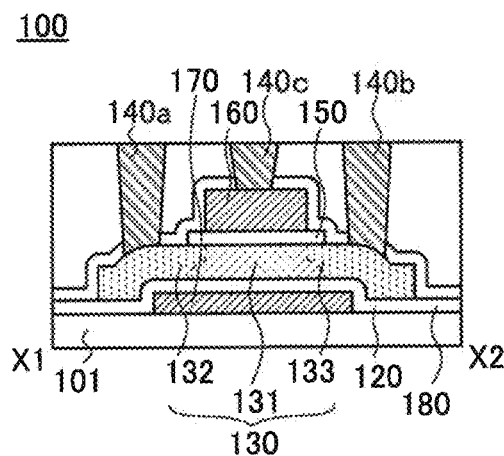
Figure 4C:
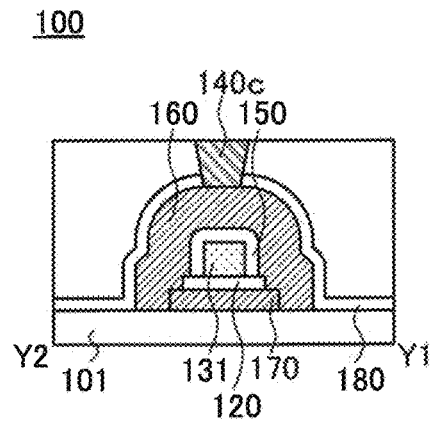

FIGS. 2A to 2C, FIGS. 3A to 3C, and FIGS. 4A to 4C illustrate examples of the transistor 100, which have structures different from that in Structural example 1 of a semiconductor device. FIG. 2A, FIG. 3A, and FIG. 4A are each a top view of the transistor 100. Note that some films are omitted in FIG. 2A, FIG. 3A, and FIG. 4A for simplicity. FIG. 2B, FIG. 3B, and FIG. 4B are cross-sectional views taken along dashed-dotted lines X1-X2 in FIG. 2A, FIG. 3A, and FIG. 4A, respectively. FIG. 2C, FIG. 3C, and FIG. 4C are cross-sectional views taken along dashed-dotted lines Y1-Y2 in FIG. 2A, FIG. 3A, and FIG. 4A, respectively.

Note that in each of the transistors 100 in FIGS. 2A to 2C, FIGS. 3A to 3C, and FIGS. 4A to 4C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131 where a channel is formed, the region 132 serving as one of a source region and a drain region, and the region 133 serving as the other of the source region and the drain region; and the insulators 120 and 150 each serving as a gate insulating layer. The region 132, the region 133, and the conductor 160 are electrically connected to the wiring 140a, the wiring 140b, and the wiring 140c, respectively.

As illustrated in each of FIGS. 2A to 2C, FIGS. 3A to 3C, and FIGS. 4A to 4C, an end portion of the insulator 150 may be positioned over the oxide 130. In this structure, a doping treatment is performed using the insulator 150 and the conductor 160 as masks. Therefore, in the doping process, the regions 132 and 133 each include a region to which an impurity is added directly and a region to which the impurity is added through the insulator 150. Accordingly, as illustrated in FIG. 2B, end portions of side surfaces of the regions 132 and 133 in the channel length direction may be shifted more to the side of an end portion of a side surface of the oxide 130 in the channel length direction as the end portions of the side surfaces of the regions 132 and 133 become farther from a top surface of the oxide 130. With this structure, the regions 132 and 133 can be prevented from being spread inward too much in the channel formation region and thus the transistor 100 can be prevented from being constantly in an on state.

As illustrated in FIGS. 3A to 3C, an end portion of the insulator 120 is not necessarily aligned with an end portion of the oxide 130. As illustrated in FIGS. 4A to 4C, the end portion of the insulator 120 may be positioned on the outer side than the end portion of the insulator 150. In the case where a material used for the insulator 150 is different from that used for the insulator 120, for example, the insulator 120 and the insulator 150 may be optimized as appropriate, for example, such that the insulator 120 and the insulator 150 have the same equivalent oxide thickness (EOT) by making the thickness of the insulator 120 different from that of the insulator 150 in consideration of their dielectric constants or the like.

MODIFICATION EXAMPLE 1 OF SEMICONDUCTOR DEVICE

FIGS. 5A to 5C, FIGS. 6A to 6C, FIGS. 7A to 7C, and FIGS. 8A to 8C illustrate modification examples of the transistor 100. FIG. 5A, FIG. 6A, FIG. 7A, and FIG. 8A are each a top view of the transistor 100. Note that some films are omitted in FIG. 5A, FIG. 6A, FIG. 7A, and FIG. 8A for simplicity. FIG. 5B, FIG. 6B, FIG. 7B, and FIG. 8B are cross-sectional views taken along dashed-dotted lines X1-X2 in FIG. 5A, FIG. 6A, FIG. 7A, and FIG. 8A, respectively. FIG. 5C, FIG. 6C, FIG. 7C, and FIG. 8C are cross-sectional views taken along dashed-dotted lines Y1-Y2 in FIG. 5A, FIG. 6A, FIG. 7A, and FIG. 8A, respectively.

Note that in the transistor 100 in each of FIGS. 5A to 5C, FIGS. 6A to 6C, FIGS. 7A to 7C, and FIGS. 8A to 8C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131 where a channel is formed, the region 132 serving as one of a source region and a drain region, and the region 133 serving as the other of the source region and the drain region; the insulators 120 and 150 each serving as a gate insulating layer. The region 132, the region 133, and the conductor 160 are electrically connected to a wiring 140a, a wiring 140b, and a wiring 140c, respectively.

As illustrated in FIGS. 5A to 5C, FIGS. 6A to 6C, FIGS. 7A to 7C, and FIGS. 8A to 8C, the conductor 170 may be larger than the oxide 130, in which case coverage with films formed above the conductor 170 can be improved. That is, each of the films included in the transistor 100, such as the oxide 130, can be formed without loss of planarity, so that the transistor can have high reliability.

Figure 5A:
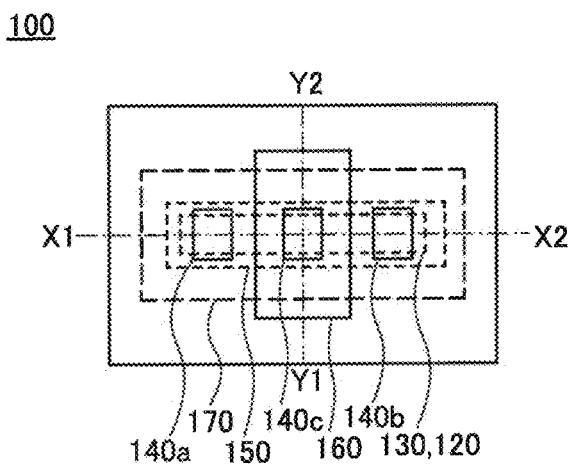
FIGS. 5A to 5C are a top view and cross-sectional views illustrating one embodiment of a semiconductor device.
Figure 5B:
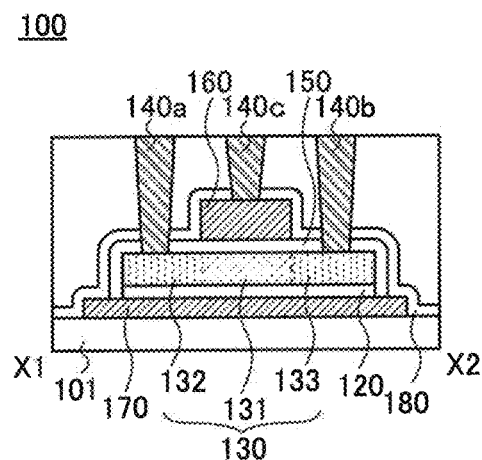
Figure 5C:
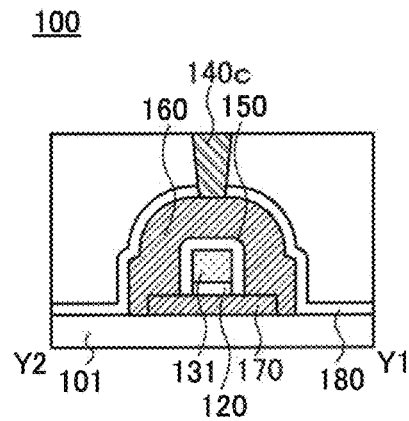

In the structure illustrated in FIGS. 5A to 5C, the end portion of the insulator 120 is aligned with the end portion of the oxide 130. Therefore, the insulator 120 and the oxide 130 can be formed at the same time, leading to a reduction in the number of masks.

Figure 6A:
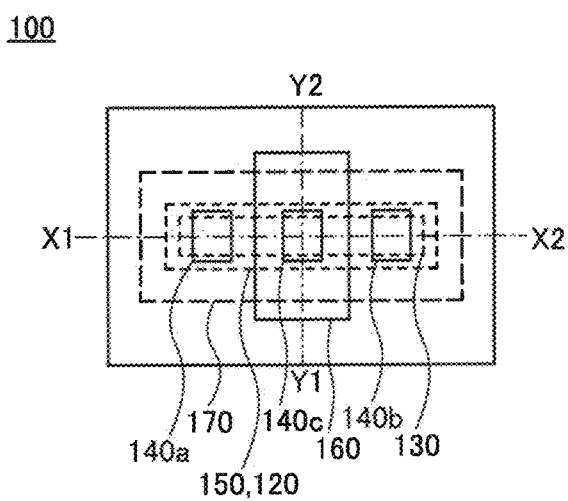
FIGS. 6A to 6C are a top view and cross-sectional views illustrating one embodiment of a semiconductor device.
Figure 6B:
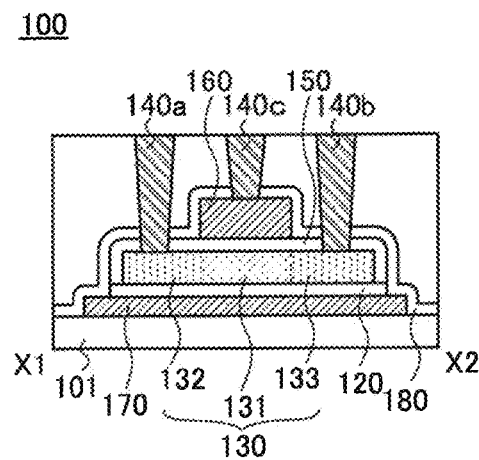
Figure 6C:
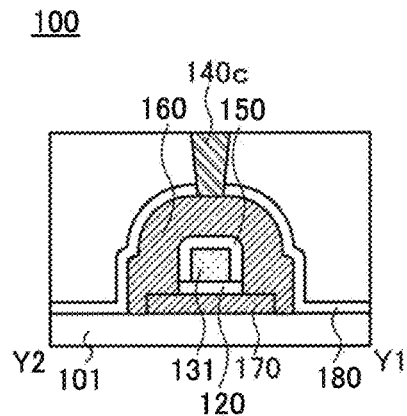
Figure 7A:
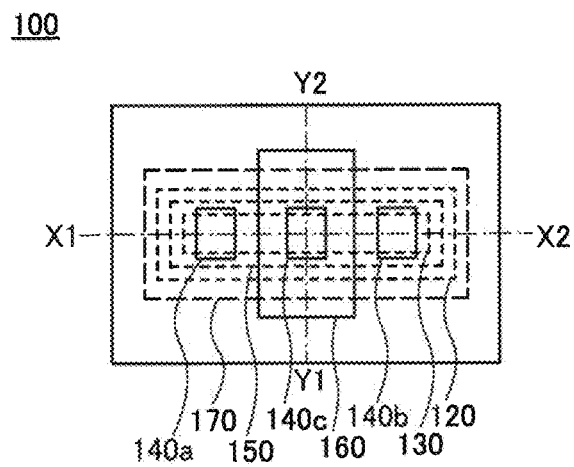
FIGS. 7A to 7C are a top view and cross-sectional views illustrating one embodiment of a semiconductor device.
Figure 7B:
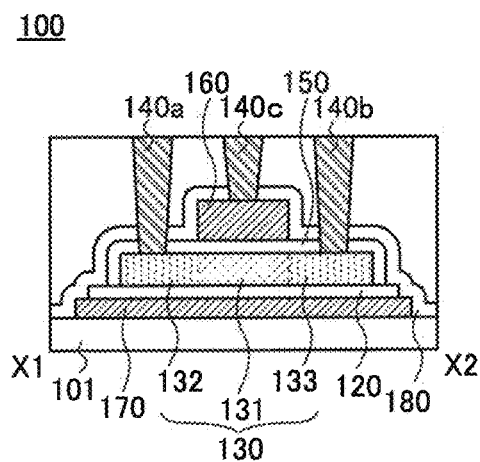
Figure 7C:
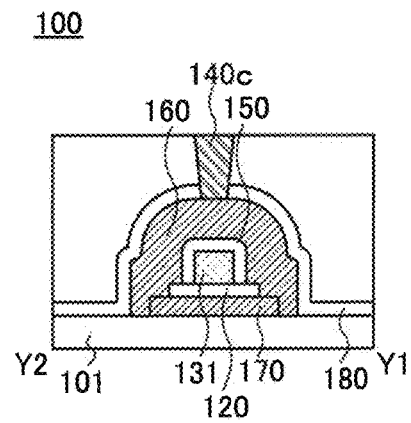

As illustrated in FIGS. 6A to 6C, the end portion of the insulator 120 is not necessarily aligned with the end portion of the oxide 130. As illustrated in FIGS. 7A to 7C, the end portion of the insulator 120 may be positioned on the outer side than the end portion of the insulator 150. In the case where a material used for the insulator 150 is different from that used for the insulator 120, for example, the insulator 120 and the insulator 150 may be optimized as appropriate, for example, such that the insulator 120 and the insulator 150 have the same equivalent oxide thickness (EOT) by making the thickness of the insulator 120 different from that of the insulator 150 in consideration of their dielectric constants or the like.

Figure 8A:
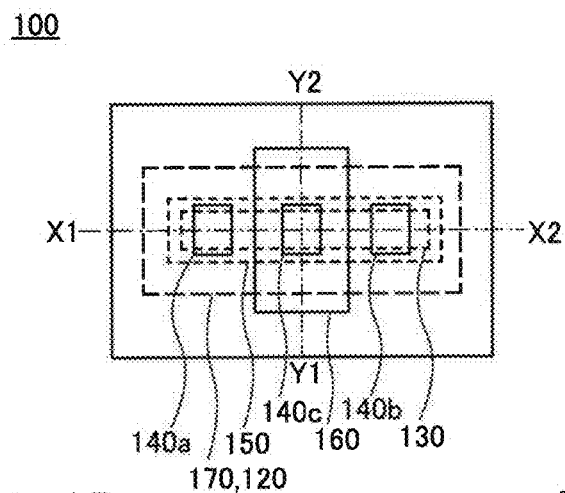
FIGS. 8A to 8C are a top view and cross-sectional views illustrating one embodiment of a semiconductor device.
Figure 8B:
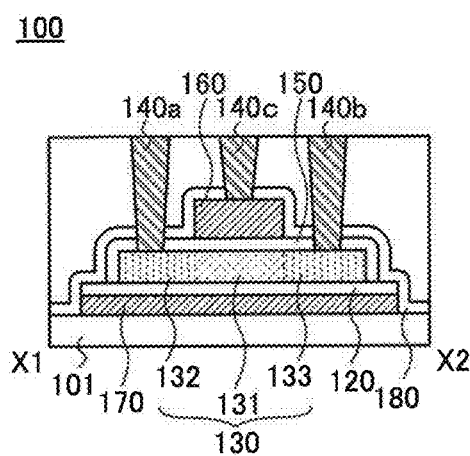
Figure 8C:
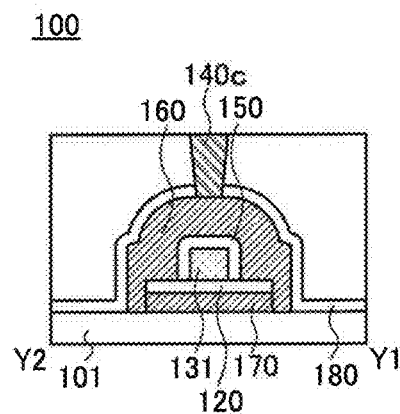

As illustrated in FIGS. 8A to 8C, the end portion of the insulator 120 may be aligned with an end portion of the conductor 170. In this case, the conductor 170 is electrically connected to the conductor 160 through a side surface of the conductor 170. Note that in this structure, the number of masks can be reduced when the insulator 120 and the conductor 170 are formed at the same time.

Figure 9A:
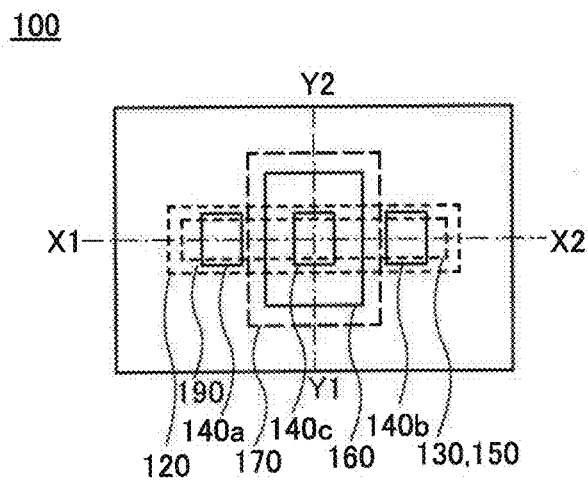
FIGS. 9A to 9C are a top view and cross-sectional views illustrating one embodiment of a semiconductor device.
Figure 9B:
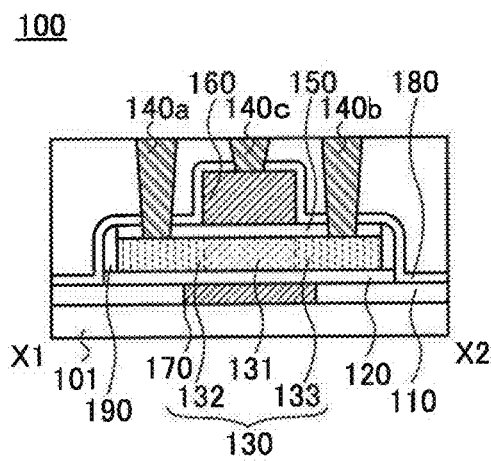
Figure 9C:
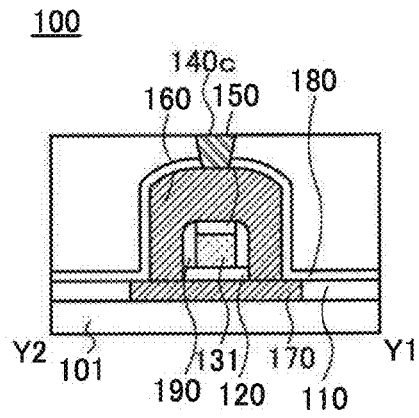
Figure 10A:
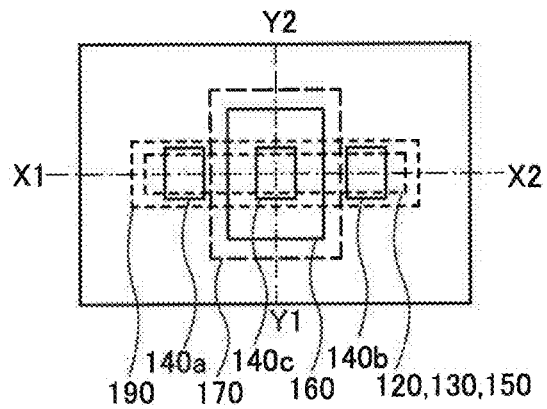
FIGS. 10A to 10C are a top view and cross-sectional views illustrating one embodiment of a semiconductor device.
Figure 10B:
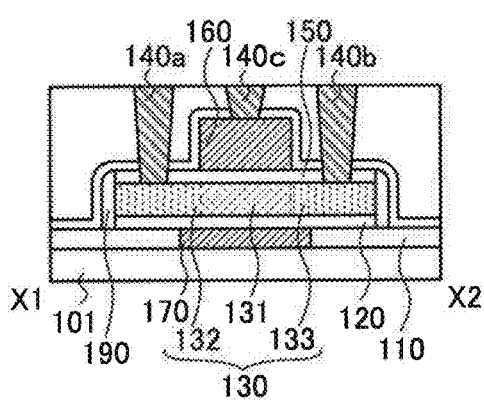
Figure 10C:
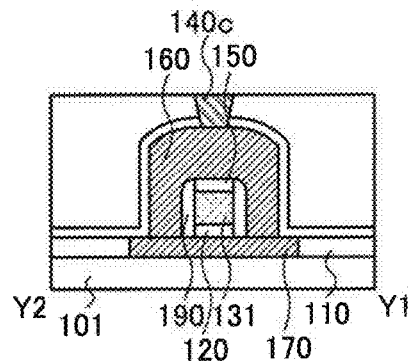

FIGS. 9A to 9C and FIGS. 10A to 10C illustrate modification examples of the transistor 100. FIG. 9A and FIG. 10A are each a top view of the transistor 100. Note that some films are omitted in FIG. 9A and FIG. 10A for simplicity. FIG. 9B and FIG. 10B are cross-sectional views taken along dashed-dotted lines X1-X2 in FIG. 9A and FIG. 10A, respectively. FIG. 9C, and FIG. 10C are cross-sectional views taken along dashed-dotted lines Y1-Y2 in FIG. 9A and FIG. 10A, respectively.

Note that in the transistor 100 in each of FIGS. 9A to 9C and FIGS. 10A to 10C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131 where a channel is formed, the region 132 serving as one of a source region and a drain region, and the region 133 serving as the other of the source region and the drain region; the insulators 120 and 150 each serving as a gate insulating layer. The region 132, the region 133, and the conductor 160 are electrically connected to a wiring 140a, a wiring 140b, and a wiring 140c, respectively.

As illustrated in FIGS. 9A to 9C and FIGS. 10A to 10C, the conductor 170 may be embedded in an insulator 110. For example, the insulator 110 is formed after formation of the conductor 170 and is removed by chemical mechanical polishing (CMP) until the conductor 170 is exposed. Note that when the conductor 170 is formed as an embedded electrode, coverage with the films formed above the conductor 170 can be improved.

As illustrated in FIGS. 9A to 9C, after formation of the oxide 130 and the insulator 150, an insulator 190 may be formed on side surfaces of the oxide 130 and the insulator 150. For example, when the insulator 190 is provided as a sidewall insulator, further miniaturization can be achieved. In the case where materials used for the insulators 120, 150, and 190 are different from one another, for example, the insulators 120, 150, and 190 may be optimized as appropriate, for example, such that the insulators 120, 150 and 190 have the same equivalent oxide thickness (EOT) by making the thicknesses of the insulators 120, 150, and 190 different from one another in consideration of their dielectric constants or the like. The insulators 190, 120, and 150 may each have a stacked-layer structure.

As illustrated in FIGS. 10A to 10C, the end portions of the insulator 120, the oxide 130, and the insulator 150 may be aligned with one another. In the structure illustrated in FIGS. 10A to 10C, the number of masks can be reduced when the insulator 120, the insulator 150, and the oxide 130 are formed at the same time.

MODIFICATION EXAMPLE 3 OF SEMICONDUCTOR DEVICE

FIGS. 11A to 11C, FIGS. 12A to 12C, FIGS. 13A to 13C, FIGS. 14A to 14C, and FIGS. 15A to 15C are top views and cross-sectional views illustrating modification examples of the transistor 100. FIG. 11A, FIG. 12A, FIG. 13A, FIG. 14A, and FIG. 15A are each a top view of the transistor 100. Note that some films are omitted in FIG. 11A, FIG. 12A, FIG. 13A, FIG. 14A, and FIG. 15A for simplicity. FIG. 11B, FIG. 12B, FIG. 13B, FIG. 14B, and FIG. 15B are cross-sectional views taken along dashed-dotted lines X1-X2 in FIG. 11A, FIG. 12A, FIG. 13A, FIG. 14A, and FIG. 15A, respectively. FIG. 11C, FIG. 12C, FIG. 13C, FIG. 14C, and FIG. 8C are cross-sectional views taken along dashed-dotted lines Y1-Y2 in FIG. 11A, FIG. 12A, FIG. 13A, FIG. 14A, and FIG. 15A, respectively.

Note that in the transistor 100 in each of FIGS. 11A to 11C, FIGS. 12A to 12C, FIGS. 13A to 13C, FIGS. 14A to 14C, and FIGS. 15A to 15C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131 where a channel is formed, the region 132 serving as one of a source region and a drain region, and the region 133 serving as the other of the source region and the drain region; the insulators 120 and 150 each serving as a gate insulating layer. The region 132, the region 133, and the conductor 160 are electrically connected to the wiring 140a, the wiring 140b, and the wiring 140c, respectively.

As illustrated in each of FIGS. 11A to 11C, FIGS. 12A to 12C, FIGS. 13A to 13C, FIGS. 14A to 14C, and FIGS. 15A to 15C, the conductor 170, the insulator 120, and the oxide 130 may be provided in an opening in the insulator 110. For example, an opening is formed in the insulator 110 with use of a dummy layer or the like, and part of the transistor 100 is provided in the opening. This structure can reduce variation in the case where a plurality of transistors are formed.

Figure 11A:
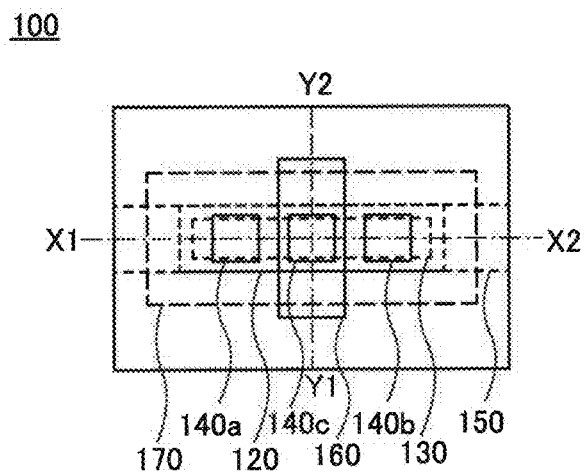
FIGS. 11A to 11C are a top view and cross-sectional views illustrating one embodiment of a semiconductor device.
Figure 11B:
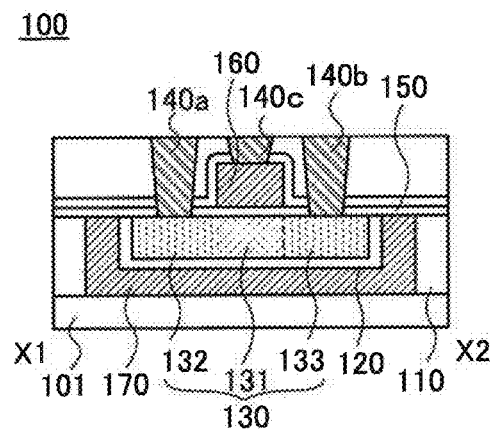
Figure 11C:
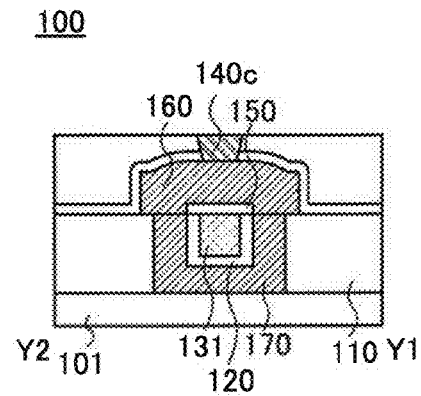

The structure illustrated in FIGS. 11A to 11C can be obtained in such a manner that the conductor 170, the insulator 120, and the oxide 130 are formed in the opening, and then planarization treatment is performed until a top surface of the insulator 110 is exposed. After that, the insulator 150 and the conductor 160 are formed. As the planarization treatment, CMP or the like can be used, for example.

Figure 12A:
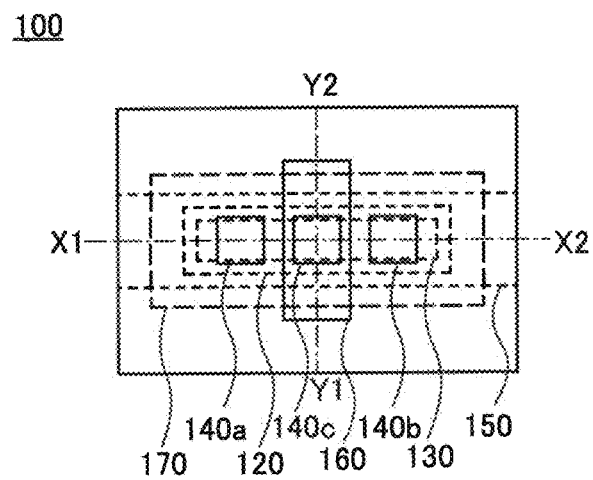
FIGS. 12A to 12C are a top view and cross-sectional views illustrating one embodiment of a semiconductor device.
Figure 12B:
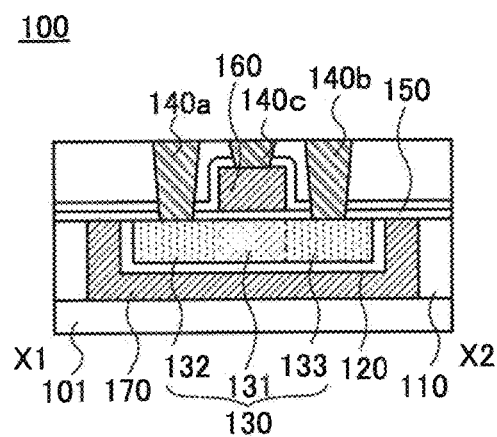
Figure 12C:
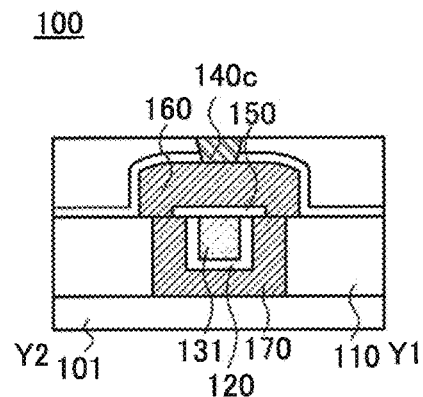
Figure 13A:
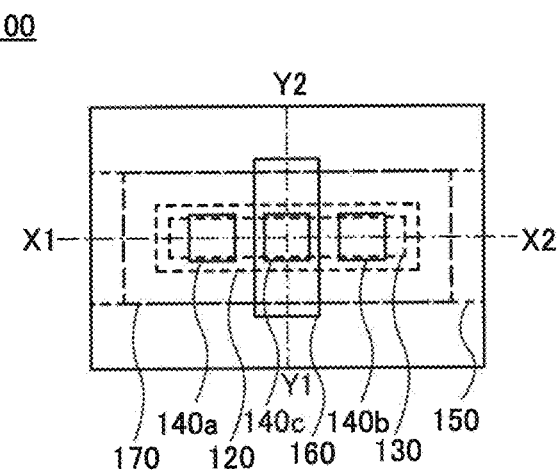
FIGS. 13A to 13C are a top view and cross-sectional views illustrating one embodiment of a semiconductor device.
Figure 13B:
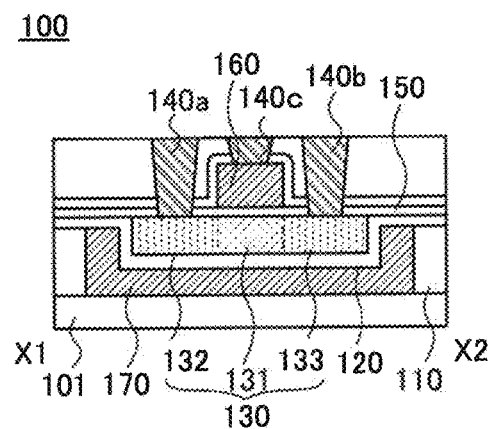
Figure 13C:
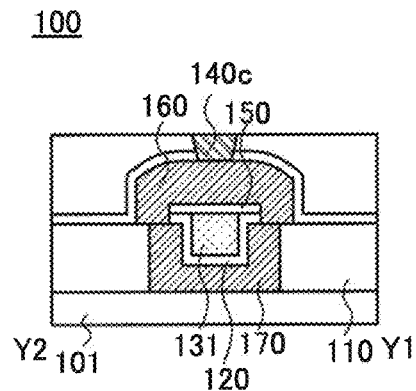

As illustrated in FIGS. 12A to 12C, the end portion of the insulator 150 is not necessarily aligned with the end portion of the insulator 120. As illustrated in FIGS. 13A to 13C, the end portions of the insulators 150 and 120 are not necessarily on an extended line of a side surface of an opening in the conductor 170. In this case, the insulator 120 can be used as a stopper film.

Figure 14A:
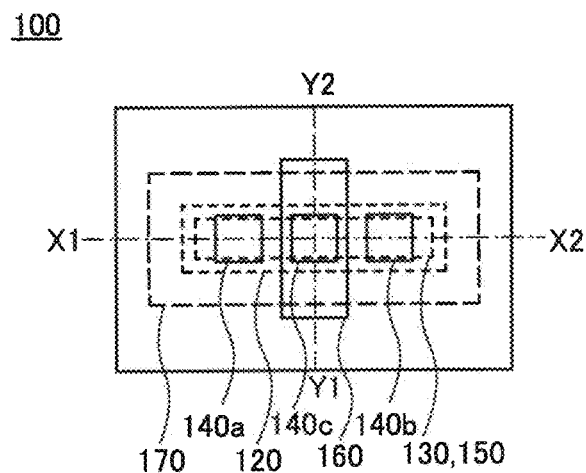
FIGS. 14A to 14C are a top view and cross-sectional views illustrating one embodiment of a semiconductor device.
Figure 14B:
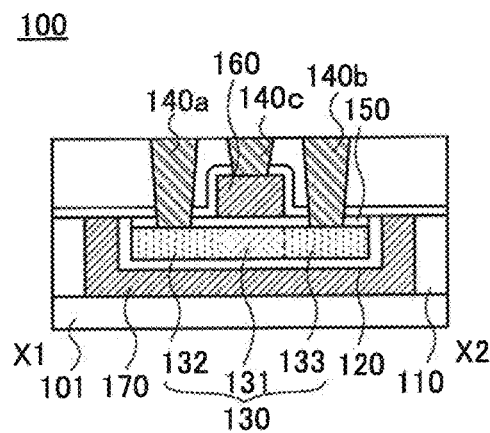
Figure 14C:
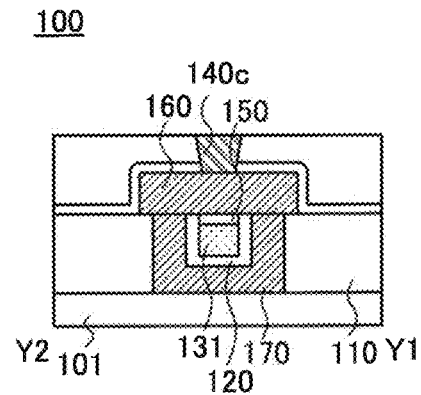
Figure 15A:
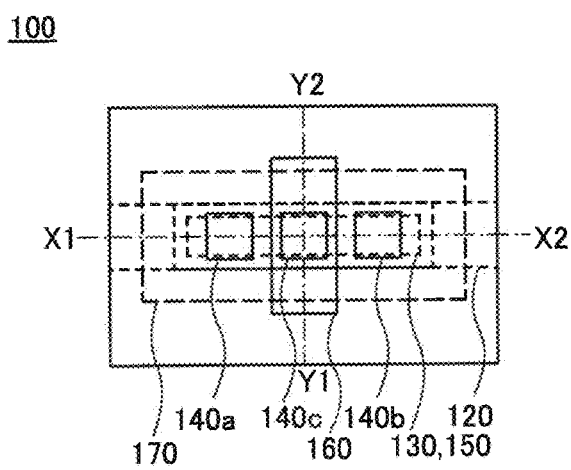
FIGS. 15A to 15C are a top view and cross-sectional views illustrating one embodiment of a semiconductor device.
Figure 15B:
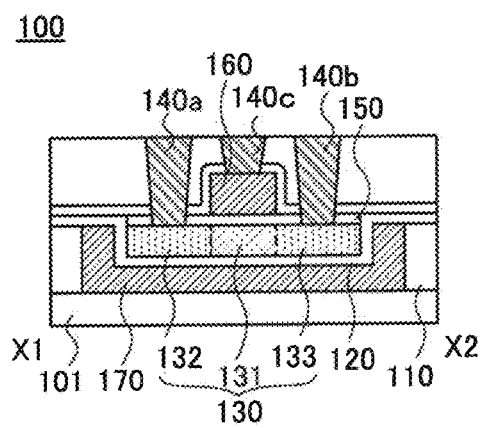
Figure 15C:
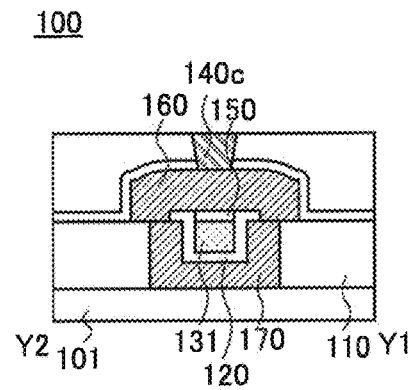

As illustrated in FIGS. 14A to 14C, the insulator 150 may be embedded in the opening. As illustrated in and FIGS. 15A to 15C, a top surface of the insulator 150 may be level with a top surface of the insulator 120. For example, after only the oxide 130 is overetched, the insulator 150 is formed.

STRUCTURAL EXAMPLE 3 OF SEMICONDUCTOR DEVICE

Figure 16A:
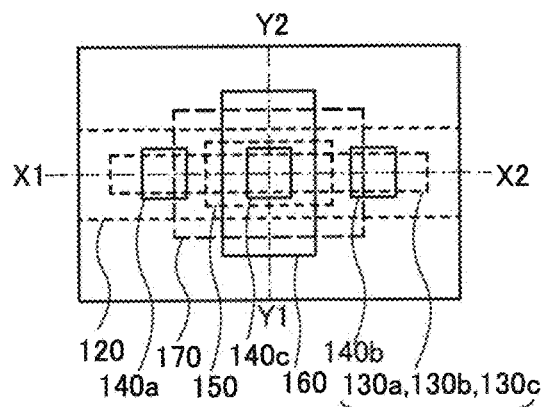
FIGS. 16A to 16C are a top view and cross-sectional views illustrating one embodiment of a semiconductor device.
Figure 16B:
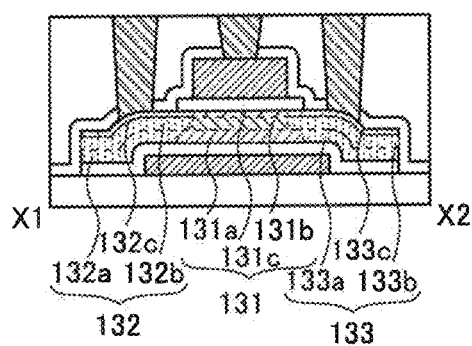
Figure 16C:
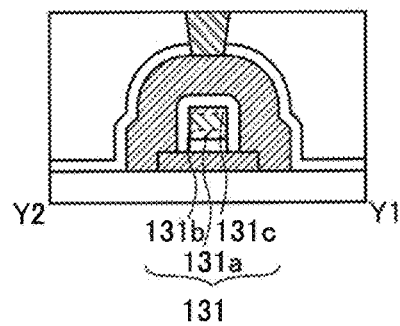
Figure 17A:
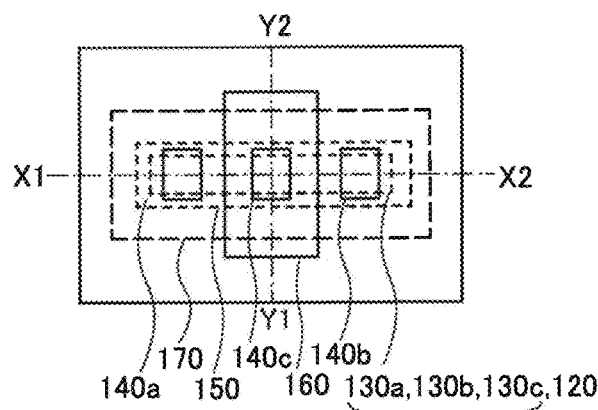
FIGS. 17A to 17C are a top view and cross-sectional views illustrating one embodiment of a semiconductor device.
Figure 17B:
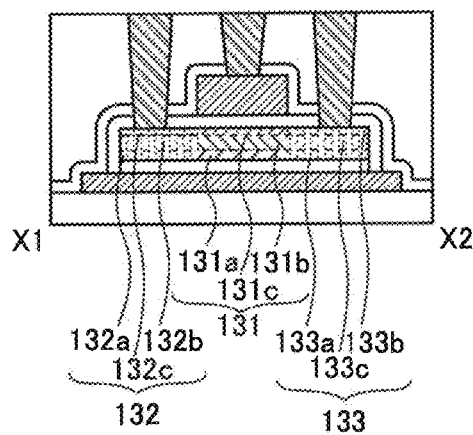
Figure 17C:
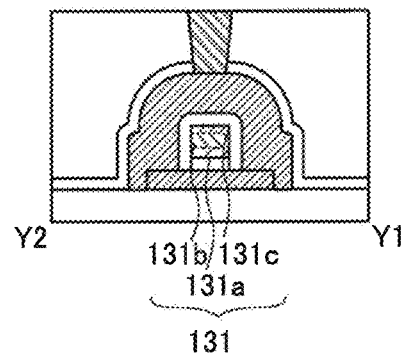
Figure 18A:
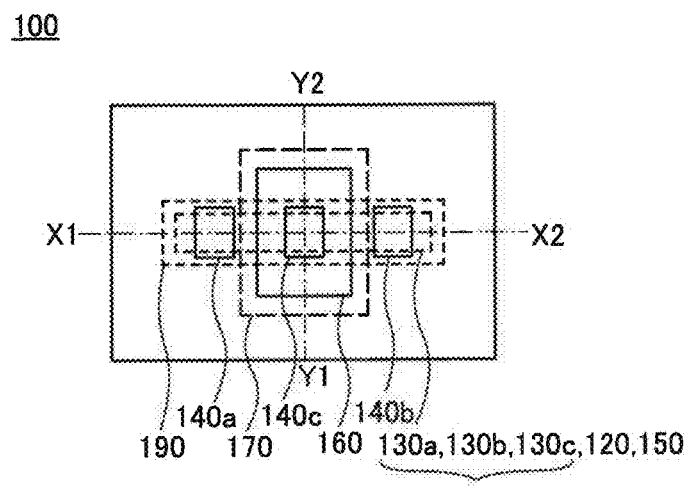
FIGS. 18A to 18C are a top view and cross-sectional views illustrating one embodiment of a semiconductor device.
Figure 18B:
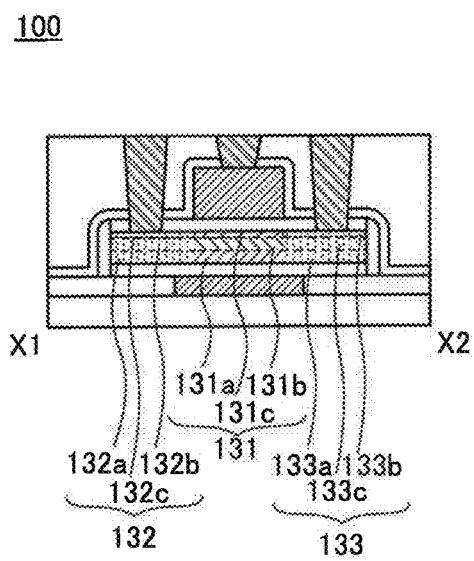
Figure 18C:
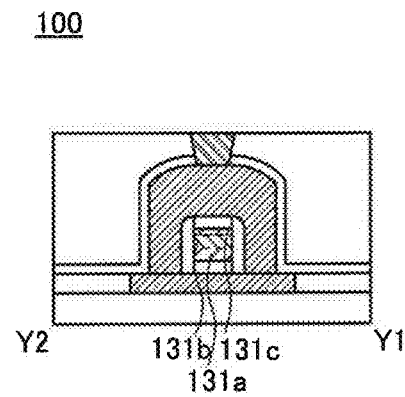

FIGS. 16A to 16C, FIGS. 17A to 17C, and FIGS. 18A to 18C illustrate modification examples of the transistor 100. FIG. 16A, FIG. 17A, and FIG. 18A are each a top view of the transistor 100. Note that some films are omitted in FIG. 16A, FIG. 17A, and FIG. 18A for simplicity. FIG. 16B, FIG. 17B, and FIG. 18B are cross-sectional views taken along dashed-dotted lines X1-X2 in FIG. 16A, FIG. 17A, and FIG. 18A, respectively. FIG. 16C, FIG. 17C, and FIG. 18C are cross-sectional views taken along dashed-dotted lines Y1-Y2 in FIG. 16A, FIG. 17A, and FIG. 18A, respectively.

Note that in the transistor 100 in each of FIGS. 16A to 16C, FIGS. 17A to 17C, and FIGS. 18A to 18C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131, the region 132 serving as one of a source region and a drain region, and the region 133 serving as the other of the source region and the drain region; the insulators 120 and 150 each serving as a gate insulating layer. The region 132, the region 133, and the conductor 160 are electrically connected to the wiring 140a, the wiring 140b, and the wiring 140c, respectively.

In each of the transistors 100 illustrated in FIGS. 16A to 16C, FIGS. 17A to 17C, and FIGS. 18A to 18C, the oxide 130 includes an insulator 130a including a region 131a, a region 132a, and a region 133a; a semiconductor 130b including a region 131b, a region 132b, and a region 133b, which is provided over the insulator 130a; and an insulator 130c including a region 131c, a region 132c, and a region 133c, which is provided over the semiconductor 130b. In the insulator 130a, the resistances of the regions 132a and 133a are reduced, and the region 131a is in contact with the regions 132a and 133a. In the semiconductor 130b, the resistances of the regions 132b and 133b are reduced, and the region 131b is in contact with the regions 132b and 133b. In the insulator 130c, the resistances of the regions 132c and 133c are reduced, and the region 131c is in contact with the regions 132c and 133c. Note that the regions 131a, 131b, and 131c are referred to as the region 131. The regions 132a, 132b, and 132c are referred to as the region 132. The regions 133a, 133b, and 133c are referred to as the region 133.

That is, the insulator 130a, the semiconductor 130b, and the insulator 130c include the region 132, the region 133, and the region 131. The impurity concentration is higher in the regions 132 and 133 than in the region 131, and the resistances of the regions 132 and 133 are lower than the resistance of the region 131. Here, in the insulator 130a, the semiconductor 130b, and the insulator 130c, the region 131 is a region excluding the regions 132 and 133.

The semiconductor 130b is an oxide semiconductor containing indium, for example. The semiconductor 130b can have high carrier mobility (electron mobility) by containing indium, for example. The semiconductor 130b preferably contains an element M. The element M is preferably Ti, Ga, Y, Zr, La, Ce, Nd, Sn, or Hf Note that two or more of the above elements may be used in combination as the element M The element M is an element having a high bonding energy with oxygen, for example. The element M is an element whose bonding energy with oxygen is higher than that of indium. The element M is an element that can increase the energy gap of the oxide semiconductor, for example. Furthermore, the semiconductor 130b preferably contains zinc. When the oxide semiconductor contains zinc, the oxide semiconductor is easily to be crystallized, for example.

Note that the semiconductor 130b is not limited to the oxide semiconductor containing indium. The semiconductor 130b may be, for example, an oxide semiconductor that does not contain indium and contains zinc, an oxide semiconductor that does not contain indium and contains gallium, or an oxide semiconductor that does not contain indium and contains tin, e.g., a zinc tin oxide or a gallium tin oxide.

The insulator 130a and the insulator 130c include one or more elements, or two or more elements other than oxygen included in the semiconductor 130b. Since the insulator 130a and the insulator 130c each include one or more elements, or two or more elements other than oxygen included in the semiconductor 130b, a defect state is less likely to be formed at the interface between the insulator 130a and the semiconductor 130b and the interface between the semiconductor 130b and the insulator 130c.

The insulator 130a, the semiconductor 130b, and the insulator 130c preferably include at least indium. In the case of using an In-M-Zn oxide as the insulator 130a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 130*b*, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 130*c*, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the insulator 130*a* or the insulator 130*c* does not necessarily contain indium in some cases. For example, the insulator 130*a* or the insulator 130*c* may be gallium oxide. Note that the atomic ratios of the elements included in the insulator 130*a*, the semiconductor 130*b*, and the insulator 130*c* are not necessarily simple ratios of integers.

Typical examples of the atomic ratio of the metal elements of the target used for the insulator 130*a* or the insulator 130*c* are In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, and In:M:Zn=1:6:9.

In the case of deposition using a sputtering method, typical examples of the atomic ratio between the metal elements of a target that is used for the semiconductor 130*b* include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. In particular, when a sputtering target with an atomic ratio of In to Ga and Zn of 4:2:4.1 is used, the atomic ratio of In to Ga and Zn in the semiconductor 130*b* may be 4:2:3 or in the neighborhood of 4:2:3.

An indium gallium oxide has a small electron affinity and a high oxygen-blocking property. Therefore, the insulator 130*c* preferably includes an indium gallium oxide. The gallium atomic ratio [Ga/(In+Ga)] is, for example, higher than or equal to 70%, preferably higher than or equal to 80%, and further preferably higher than or equal to 90%.

The semiconductor 130*b* is formed using, for example, an oxide with a wide energy gap. The energy gap of the semiconductor 130*b* is, for example, 2.5 eV or larger and 4.2 eV or smaller, preferably 2.8 eV or larger and 3.8 eV or smaller, and further preferably 3 eV or larger and 3.5 eV or smaller. Here, the energy gap of the insulator 130*a* is larger than that of the semiconductor 130*b*. The energy gap of the insulator 130*c* is larger than that of the semiconductor 130*b*.

As the semiconductor 130*b*, an oxide having an electron affinity larger than that of the insulator 130*a* or the insulator 130*c* is used. For example, as the semiconductor 130*b*, an oxide having an electron affinity larger than those of the insulators 130*a* and 130*c* by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy gap between the vacuum level and the conduction band minimum. In other words, the energy level of the conduction band minimum of the insulator 130*a* or 130*c* is closer to the vacuum level than the energy level of the conduction band minimum of the semiconductor 130*b* is.

In this case, when a gate voltage is applied, a channel is formed not in the insulator 130*a* or the insulator 130*c* but in the semiconductor 130*b* having a larger electron affinity.

The insulator 130*a* and the insulator 130*c* are formed using a substance that can function as a conductor, a semiconductor, or an insulator when they are used alone. However, when the transistor is formed by stacking the semiconductor 130*b*, electrons flow in the semiconductor 130*b*, in the vicinity of an interface between the semiconductor 130*b* and the insulator 130*a*, and in the vicinity of an interface between the semiconductor 130*b* and the insulator 130*c*, and some regions of the insulators 130*a* and 130*c* do not serve as a channel of the transistor. For that reason, in this specification and the like, the insulators 130*a* and 130*c* are not referred to as semiconductors but insulators. Note that the reason why the insulator 130*a* and the insulator 130*c* are each referred to as an insulator is because they are closer to an insulator than the semiconductor 130*b* is in terms of their functions in a transistor, and the substance that can be used for the semiconductor 130*b* is used for the insulator 130*a* and the insulator 130*c* in some cases.

Here, in some cases, there is a mixed region of the insulator 130*a* and the semiconductor 130*b* between the insulator 130*a* and the semiconductor 130*b*. In addition, in some cases, there is a mixed region of the insulator 130*c* and the semiconductor 130*b* between the insulator 130*c* and the semiconductor 130*b*. The mixed region has a low density of defect states. For that reason, the stack including the insulator 130*a*, the semiconductor 130*b*, and the insulator 130*c* has a band structure where energy is changed continuously at each interface and in the vicinity of the interface (continuous junction). Note that boundaries of the insulator 130*a*, the semiconductor 130*b*, and the insulator 130*c* are not clear in some cases.

At this time, electrons move mainly in the semiconductor 130*b*, not in the insulator 130*a* and the insulator 130*c*. As described above, when the density of defect states at the interface between the insulator 130*a* and the semiconductor 130*b* and the density of defect states at the interface between the semiconductor 130*b* and the insulator 130*c* are decreased, electron movement in the semiconductor 130*b* is less likely to be inhibited and the on-sate current of the transistor can be increased.

As factors in inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 µm×1 µm of the top surface or the bottom surface of the semiconductor 130*b* (a formation surface; here, a top surface of the insulator 130*a*) is less than 1 nm, preferably less than 0.6 nm, further preferably less than 0.5 nm, and still further preferably less than 0.4 nm. The average surface roughness (also referred to as Ra) with the measurement area of 1 µm×1 µm is less than 1 nm, preferably less than 0.6 nm, further preferably less than 0.5 nm, and still further preferably less than 0.4 nm. The maximum difference (P−V) with the measurement area of 1 µm×1 µm is less than 10 nm, preferably less than 9 nm, further preferably less than 8 nm, and still further preferably less than 7 nm. RMS roughness, Ra, and P−V can be measured using a scanning probe microscope SPA-500 manufactured by SII Nano Technology Inc.

The insulators 130*a* and 130*c* have a function of blocking entry of elements other than oxygen (such as hydrogen and silicon) included in the adjacent insulator into the semiconductor 130*b* where a channel is formed. Furthermore, a distance from the interface between the adjacent insulator and the insulator 130*a* to the semiconductor 130*b* in which a channel is formed is made large, whereby impurities can be prevented from being diffused into the semiconductor 130b where a channel is formed.

For example, silicon in the oxide semiconductor might serve as a carrier trap or a carrier generation source. Therefore, the silicon concentration of the semiconductor 130b is preferably as low as possible. For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 130b and the insulator 130a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, and further preferably higher than or equal to $1\times10^{16}$ atoms/cm$^3$ and lower than or equal to $2\times10^{18}$ atoms/cm$^3$ is provided between the semiconductor 130b and the insulator 130c.

It is preferable to reduce the concentration of hydrogen in the insulator 130a and the insulator 130c in order to reduce the concentration of hydrogen in the semiconductor 130b. The insulator 130a and the insulator 130c each include a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. It is preferable to reduce the concentration of nitrogen in the insulator 130a and the insulator 130c in order to reduce the concentration of nitrogen in the semiconductor 130b. The insulator 130a and the insulator 130c each include a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, and still further preferably higher than or equal to $1\times10^{15}$ atoms/cm$^3$ and lower than or equal to $5\times10^{17}$ atoms/cm$^3$.

Each of the insulator 130a, the semiconductor 130b, and the insulator 130c described in this embodiment, especially, the semiconductor 130b, is an oxide semiconductor with a low impurity concentration and a low density of defect states (a small number of oxygen vacancies) and thus can be referred to as a highly purified intrinsic or substantially highly purified intrinsic oxide semiconductor. A highly purified intrinsic or substantially highly purified intrinsic oxide semiconductor has few carrier generation sources, and thus has a low carrier density. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, the highly purified intrinsic or substantially highly purified intrinsic oxide semiconductor has an extremely low off-state current; even when an element has a channel width W of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor can have a small variation in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. As examples of the impurities, hydrogen, nitrogen, alkali metal, alkaline earth metal, and the like are given.

Hydrogen contained in the insulator 130a, the semiconductor 130b, and the insulator 130c reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor which contains hydrogen is likely to be normally on. Accordingly, the amount of hydrogen included in the insulator 130a, the semiconductor 130b, and the insulator 130c is preferably as small as possible. Specifically, the hydrogen concentration of the insulator 130a, the semiconductor 130b, and the insulator 130c, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$, yet further preferably lower than or equal to $1\times10^{18}$ atoms/cm$^3$, even further preferably lower than or equal to $5\times10^{17}$ atoms/cm$^3$, and further preferably lower than or equal to $1\times10^{16}$ atoms/cm$^3$.

When the insulator 130a, the semiconductor 130b, and the insulator 130c contain silicon or carbon, which is one of elements belonging to Group 14, oxygen vacancies in the insulator 130a, the semiconductor 130b, and the insulator 130c are increased, which makes the insulator 130a, the semiconductor 130b, and the insulator 130c n-type. Thus, the concentration of silicon or carbon (the concentration is measured by SIMS) in the insulator 130a, the semiconductor 130b, and the insulator 130c, or the concentration of silicon or carbon (the concentration is measured by SIMS) in the vicinity of interfaces with the insulator 130a, the semiconductor 130b, and the insulator 130c is set to be lower than or equal to $2\times10^{18}$ atoms/cm$^3$, preferably lower than or equal to $2\times10^{17}$ atoms/cm$^3$.

In addition, the concentration of alkali metal or alkaline earth metal in the insulator 130a, the semiconductor 130b, and the insulator 130c, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the insulator 130a, the semiconductor 130b, and the insulator 130c.

Furthermore, when containing nitrogen, the insulator 130a, the semiconductor 130b, and the insulator 130c easily become n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible. The nitrogen concentration measured by SIMS is, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

As described above, the insulator 130a, the semiconductor 130b, and the insulator 130c described in this embodiment are each an oxide having a low impurity concentration and a low density of defect states (a small number of oxygen vacancies), and thus have a low carrier density. Therefore, the contact resistance with the wiring 140a or the wiring 140b is likely to be high. In view of this, in the transistor 100 in this embodiment, the wirings 140a and 140b are connected to the insulator 130a, the semiconductor 130b, and the insulator 130c through the regions 132 and 133 with low resistance in the oxide 130, leading to a reduction in contact resistance.

Note that the above three-layer structure including the insulator 130a, the semiconductor 130b, and the insulator 130c is just an example. For example, a two-layer structure not including the insulator 130a or the insulator 130c may be employed. Alternatively, a single-layer structure not including the insulators 130a and 130c may be employed. Further alternatively, an n-layer structure (n is an integer of 4 or more) including any of the insulator, semiconductor, and conductor given as examples of the insulators 130a and 130c and the semiconductor 130b may be employed.

In the transistor 100 illustrated in FIGS. 16A to 16C, a channel formation region is mainly formed in the region 131b. An insulator containing oxygen is preferably used as the insulator 150 in contact with the region 131b. Furthermore, when an insulator having a high barrier property is used as the insulator 120, the transistor can have higher reliability.

As illustrated in FIGS. 17A to 17C, the conductor 170 may be larger than the oxide 130, in which case coverage with films formed over the conductor 170 can be improved.

When the conductor 170 is embedded in the insulator 110 as illustrated in FIGS. 18A to 18C, coverage with films formed over the conductor 170 can be further improved. In the transistor 100 illustrated in FIGS. 18A to 18C, a channel formation region is mainly formed in the region 131b. An insulator containing oxygen is preferably used as the insulator 190 in contact with the region 131b. In addition, when an insulator having a high barrier property is used as each of the insulators 120 and 150, the transistor can have higher reliability.

STRUCTURE EXAMPLE 4 OF SEMICONDUCTOR DEVICE

FIGS. 19A to 19C, FIGS. 20A to 20C, FIGS. 21A to 21C, and FIGS. 22A to 22C illustrate modification examples of the transistor 100. FIG. 19A, FIG. 20A, FIG. 21A, and FIG. 22A are each a top view of the transistor 100. Note that some films are omitted in FIG. 19A, FIG. 20A, FIG. 21A, and FIG. 22A for simplicity. FIG. 19B, FIG. 20B, FIG. 21B, and FIG. 22B are cross-sectional views taken along dashed-dotted lines X1-X2 in FIG. 19A, FIG. 20A, FIG. 21A, and FIG. 22A, respectively. FIG. 19C, FIG. 20C, FIG. 21C, and FIG. 22C are cross-sectional views taken along dashed-dotted lines Y1-Y2 in FIG. 19A, FIG. 20A, FIG. 21A, and FIG. 22A, respectively.

Note that in the transistor 100 in each of FIGS. 19A to 19C, FIGS. 20A to 20C, FIGS. 21A to 21C, and FIGS. 22A to 22C, components having the same function as the components in the transistor 100 in FIGS. 1A to 1C are denoted by the same reference numerals. Accordingly, the transistor 100 formed over the substrate 101 includes the conductors 160 and 170 each serving as a gate electrode; the oxide 130 including the region 131 where a channel is formed, the region 132 serving as one of a source region and a drain region, and the region 133 serving as the other of the source region and the drain region; the insulators 120 and 150 each serving as a gate insulating layer. The region 132, the region 133, and the conductor 160 are electrically connected to the wiring 140a, the wiring 140b, and the wiring 140c, respectively.

In the transistor 100 illustrated in each of FIGS. 19A to 19C, FIGS. 20A to 20C, FIGS. 21A to 21C, and FIGS. 22A to 22C, the oxide 130 includes an insulator 130a including a region 131a, a region 132a, and a region 133a; a semiconductor 130b including a region 131b, a region 132b, and a region 133b, which is provided over the insulator 130a; and an insulator 130c including a region 131c, a region 132c, and a region 133c, which is provided over the semiconductor 130b. In the insulator 130a, the resistances of the regions 132a and 133a are reduced, and the region 131a is in contact with the regions 132a and 133a. In the semiconductor 130b, the resistances of the regions 132b and 133b are reduced, and the region 131b is in contact with the regions 132b and 133b. In the insulator 130c, the resistances of the regions 132c and 133c are reduced, and the region 131c is in contact with the regions 132c and 133c. Note that the regions 131a, 131b, and 131c are referred to as a region 131. The regions 132a, 132b, and 132c are referred to as a region 132. The regions 133a, 133b, and 133c are referred to as a region 133.

That is, the insulator 130a, the semiconductor 130b, and the insulator 130c include the region 132, the region 133, and the region 131. The impurity concentration is higher in the regions 132 and 133 than in the region 131, and the resistances of the regions 132 and 133 are lower than the resistance of the region 131. Here, in the insulator 130a, the semiconductor 130b, and the insulator 130c, the region 131 is a region excluding the regions 132 and 133.

As illustrated in each of FIGS. 19A to 19C, FIGS. 20A to 20C, FIGS. 21A to 21C, and FIGS. 22A to 22C, in the transistor 100, the semiconductor 130b is surrounded by the insulators 130a and 130c. Accordingly, an end portion of a side surface of the semiconductor 130b, in particular, a vicinity of the end portion of the side surface in a channel width direction, is in contact with the insulators 130a and 130c. Thus, in the vicinity of the end portion of the side surface of the semiconductor 130b, continuous junction is formed between the semiconductor 130b and the insulator 130a or between the semiconductor 130b and the insulator 130c, leading to a lower density of defect states. Accordingly, even when on-state current flows easily due to an s-channel structure, leakage current at the end portion of the side surface of the semiconductor 130b in the channel width direction is suppressed, whereby the transistor can have stable electric characteristics.

Figure 19A:
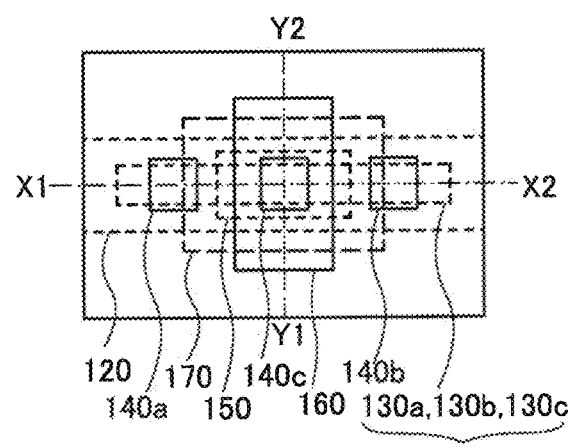
FIGS. 19A to 19C are a top view and cross-sectional views illustrating one embodiment of a semiconductor device.
Figure 19B:
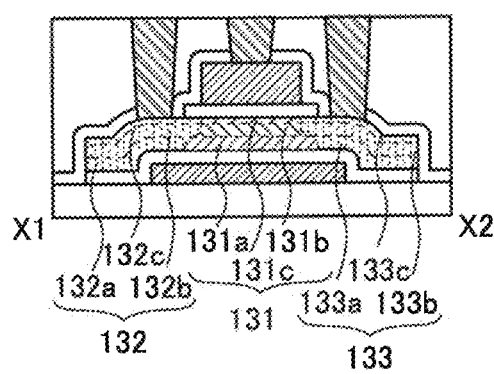
Figure 19C:
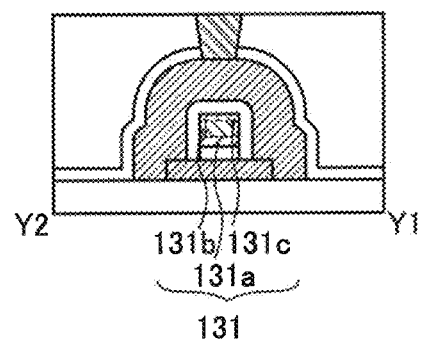
Figure 20A:
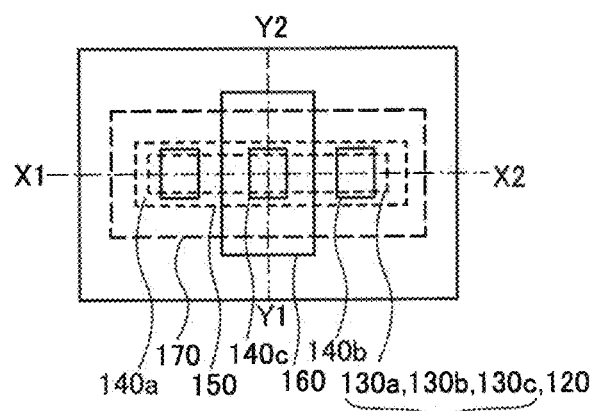
FIGS. 20A to 20C are a top view and cross-sectional views illustrating one embodiment of a semiconductor device.
Figure 20B:
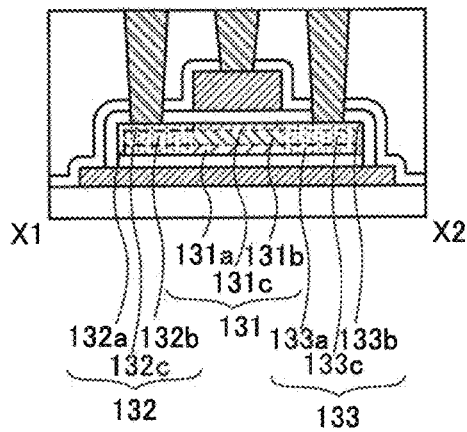
Figure 20C:
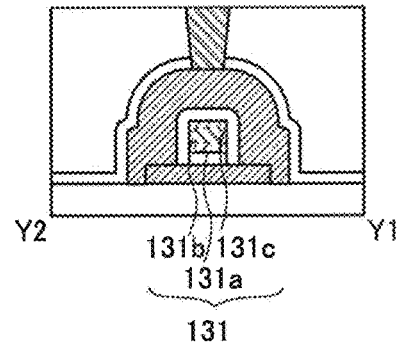

As illustrated in FIGS. 19A to 19C, a bottom surface of the insulator 130c may be formed in contact with a top surface of the insulator 130a. As illustrated in FIGS. 20A to 20C, the bottom surface of the insulator 130c may be formed in contact with the insulator 120. Note that as illustrated in FIGS. 20A to 20C, the conductor 170 may be larger than the oxide 130, in which case coverage with films formed over the conductor 170 can be improved.

Figure 21A:
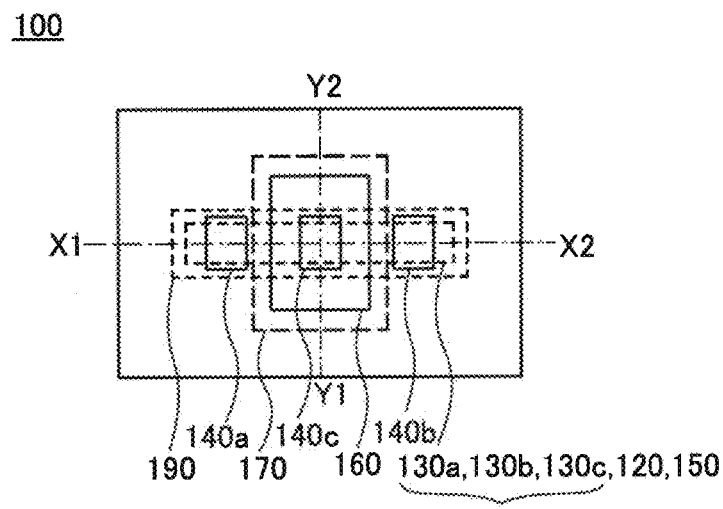
FIGS. 21A to 21C are atop view and cross-sectional views illustrating one embodiment of a semiconductor device.
Figure 21B:
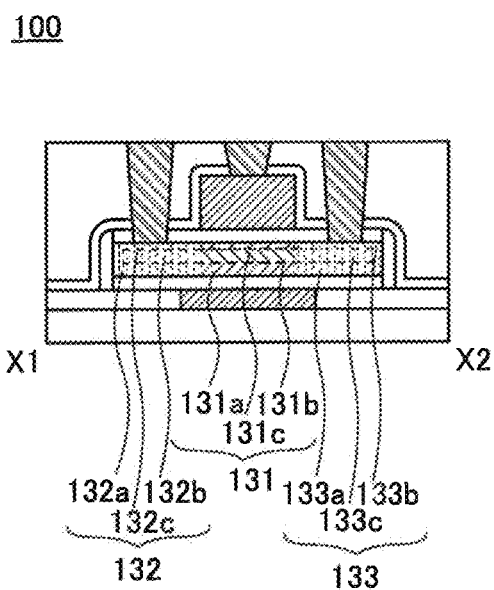
Figure 21C:
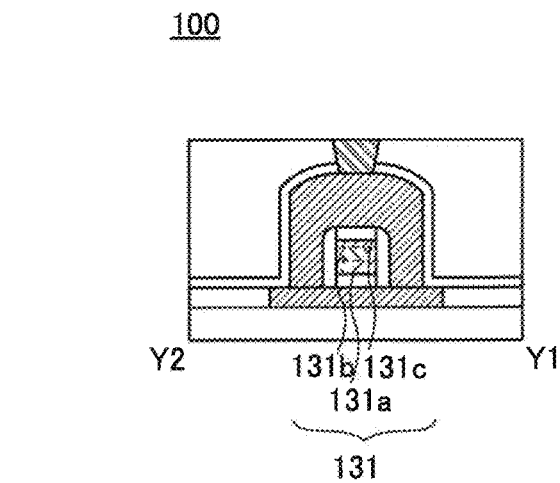

When the conductor 170 is embedded in the insulator 110 as illustrated in FIGS. 21A to 21C, coverage with a film formed above the conductor 170 can be further improved.

Figure 22A:
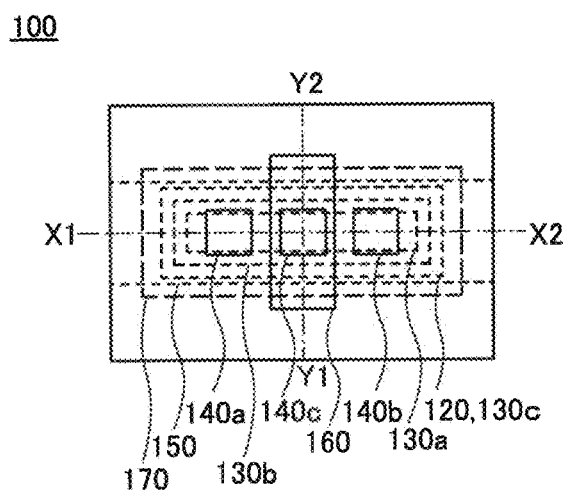
FIGS. 22A to 22C are a top view and cross-sectional views illustrating one embodiment of a semiconductor device.
Figure 22B:
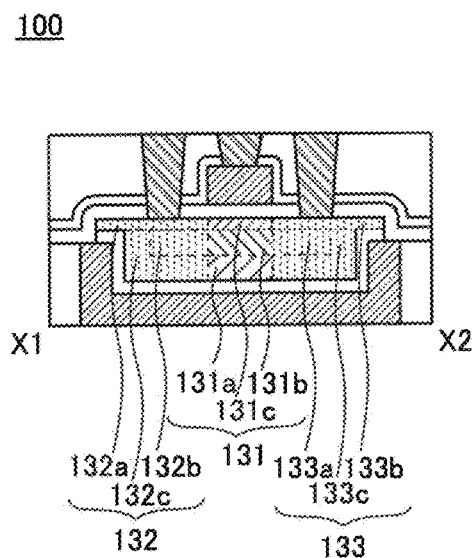
Figure 22C:
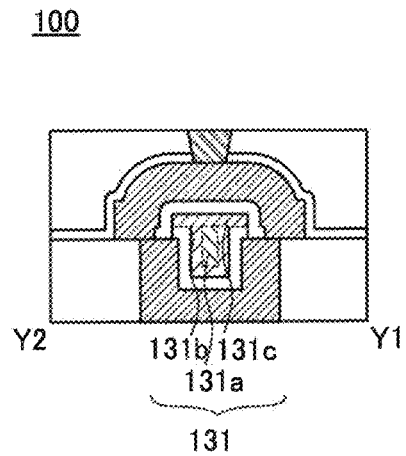

As illustrated in FIGS. 22A to 22C, it is preferable to form an opening in the insulator 110 and to form part of the transistor 100 in the opening. With this structure, a plurality of transistors can be formed with little variation.

The above-described structure makes it possible to provide a transistor with stable electric characteristics. A transistor having a low leakage current in an off state can be provided. A transistor having high on-state current can be provided. A transistor having normally-off electrical characteristics can be provided. A transistor having a small subthreshold swing value can be provided. A transistor having high reliability can be provided.

As described above, since the amount of on-state current is large and the amount of off-state current is small, the transistor can have favorable driving characteristics. Furthermore, low power consumption can be realized. Even when the channel length becomes short with miniaturization of a transistor, a transistor with highly stable electrical characteristics can be provided. That is, it is presumed that a short-channel effect can be suppressed, miniaturization can be achieved, and the integration degree of transistors can be increased, whereby a variety of small-sized electronic devices can be further downsized. In addition, a miniaturized transistor having highly stable electrical characteristics can be provided.

In Embodiment 1, one embodiment of the present invention has been described. Other embodiments of the present invention are described in Embodiments 2 to 7. Note that one embodiment of the present invention is not limited thereto. That is, since various embodiments of the present invention are disclosed in Embodiment 1 and Embodiments 2 to 7, one embodiment of the present invention is not limited to a specific embodiment. For example, an example in which a channel formation region, source and drain regions, and the like of a transistor 100 include an oxide semiconductor is described as one embodiment of the present invention; however, one embodiment of the present invention is not limited to this example. Depending on circumstances or conditions, various semiconductors may be included in a channel formation region, source and drain regions, and the like of the transistor 100, or the like of one embodiment of the present invention. Depending on circumstances or conditions, for example, the channel formation regions, the source and drain regions, and the like of the transistor 100 may include at least one of silicon, germanium, silicon germanium, silicon carbide, gallium arsenide, aluminum gallium arsenide, indium phosphide, gallium nitride, an organic semiconductor, and the like. Alternatively, depending on circumstances or conditions, the channel formation regions, the source and drain regions, and the like of the transistor 100 in one embodiment of the present invention do not necessarily include an oxide semiconductor.

Embodiment 2

STRUCTURE OF OXIDE SEMICONDUCTOR

Structures of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

CAAC-OS

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 23A:
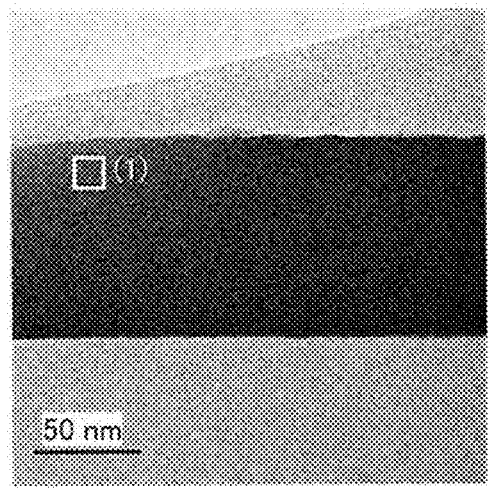
FIGS. 23A to 23D are Cs-corrected high-resolution TEM images of a cross section of a CAAC-OS and a cross-sectional schematic view of the CAAC-OS.

The CAAC-OS observed with a TEM is described below. FIG. 23A shows a high-resolution TEM image of a cross section of the CAAC-OS, which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 23B:
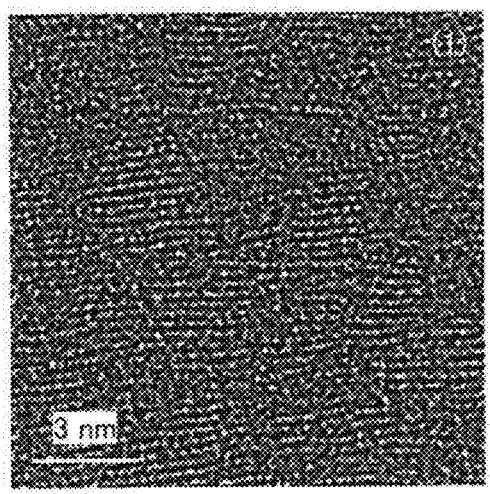

FIG. 23B is an enlarged Cs-corrected high-resolution TEM image of a region (1) in FIG. 23A. FIG. 23B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 23C:
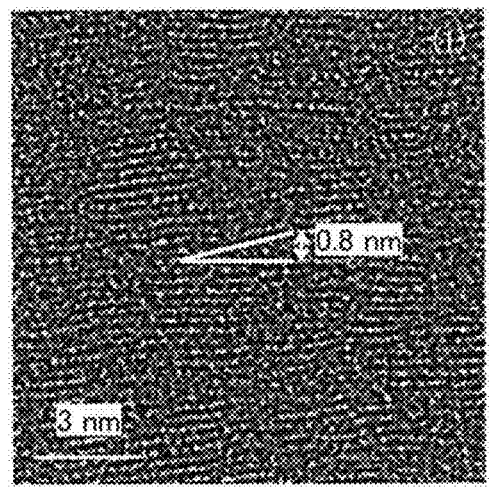

As shown in FIG. 23B, the CAAC-OS has a characteristic atomic arrangement. The characteristic atomic arrangement is denoted by an auxiliary line in FIG. 23C. FIGS. 23B and 23C prove that the size of a pellet is greater than or equal to 1 nm or greater than or equal to 3 nm, and the space between the pellets caused by the tilt is approximately 0.8 nm.

Therefore, the pellet can also be referred to as a nanocrystal (nc). Furthermore, the CAAC-OS can also be referred to as an oxide semiconductor including c-axis aligned nanocrystals (CANC).

Figure 23D:
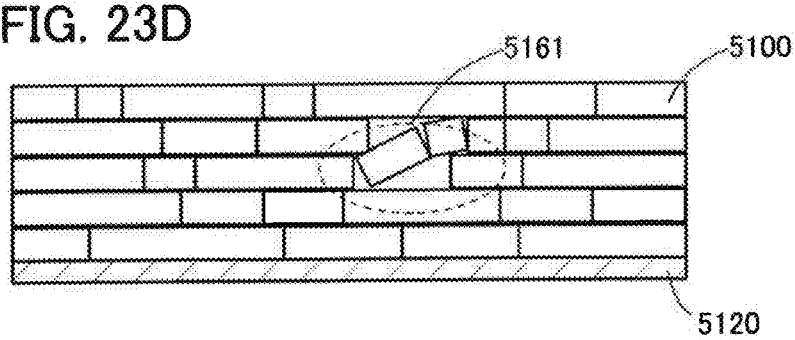

Here, according to the Cs-corrected high-resolution TEM images, the schematic arrangement of pellets 5100 of a CAAC-OS over a substrate 5120 is illustrated by such a structure in which bricks or blocks are stacked (see FIG. 23D). The part in which the pellets are tilted as observed in FIG. 10C corresponds to a region 5161 shown in FIG. 23D.

Figure 24A:
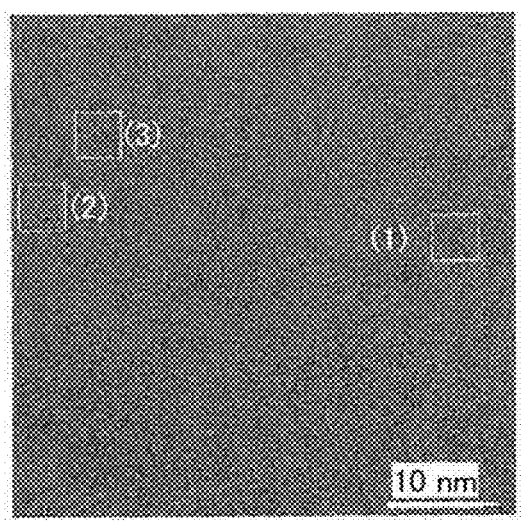
FIGS. 24A to 24D are Cs-corrected high-resolution TEM images of a plane of a CAAC-OS.
Figure 24B:
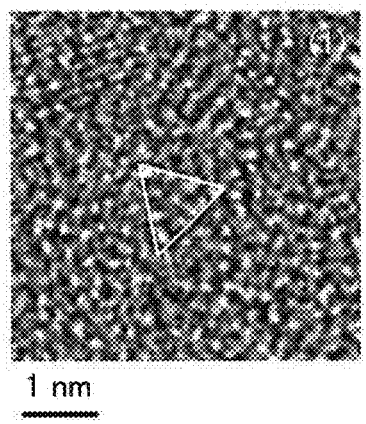
Figure 24C:
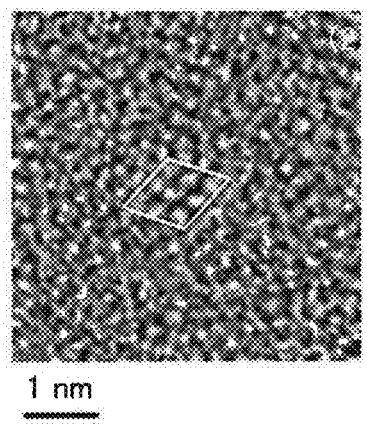
Figure 24D:
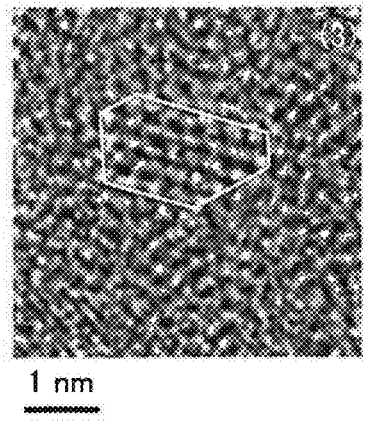

FIG. 24A shows a Cs-corrected high-resolution TEM image of a plane of the CAAC-OS observed from a direction substantially perpendicular to the sample surface. FIGS. 24B, 24C, and 24D are enlarged Cs-corrected high-resolution TEM images of regions (1), (2), and (3) in FIG. 24A, respectively. FIGS. 24B, 24C, and 24D indicate that metal atoms are arranged in a triangular, quadrangular, or hexagonal configuration in a pellet. However, there is no regularity of arrangement of metal atoms between different pellets.

Figure 25A:
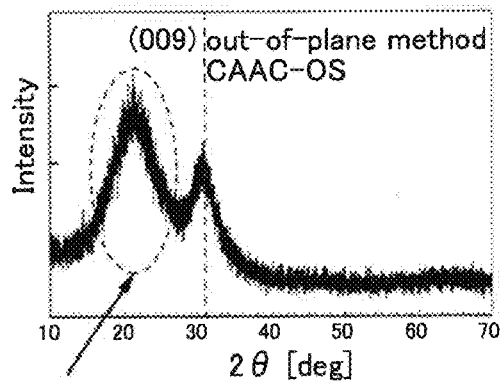
FIGS. 25A to 25C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 25A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 25B:
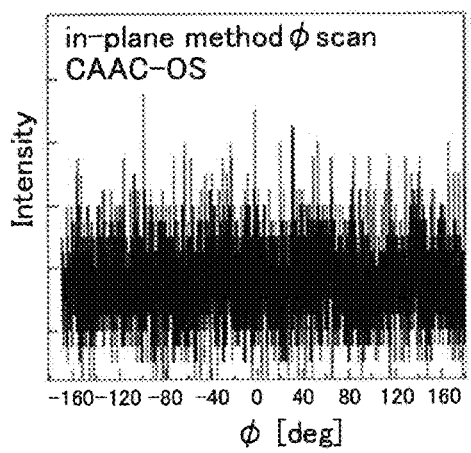
Figure 25C:
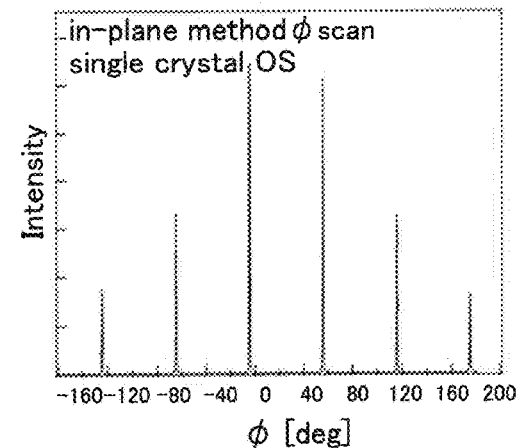

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 25B, a peak is not clearly observed. In contrast, in the case of a single crystal oxide semiconductor of $InGaZnO_4$, when φ scan is performed with 2θ fixed at around 56°, as shown in FIG. 25C, six peaks which are assigned to crystal planes equivalent to the (110) plane are observed. Accordingly, the structural analysis using XRD shows that the directions of a-axes and b-axes are irregularly oriented in the CAAC-OS.

Figure 26A:
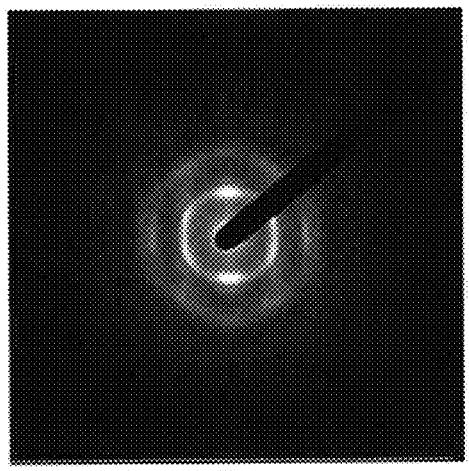
FIGS. 26A and 26B show electron diffraction patterns of a CAAC-OS.
Figure 26B:
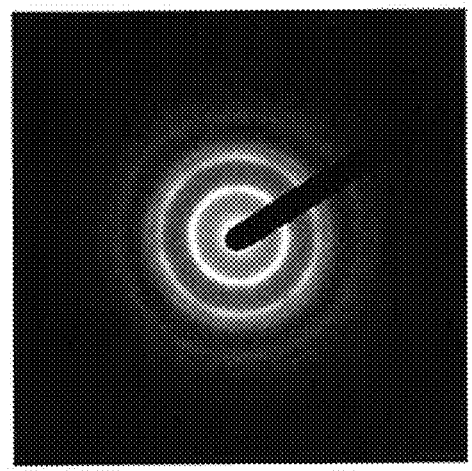

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 26A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 26B shows a diffraction pattern obtained in such a manner that an electron beam with a probe diameter of 300 nm is incident on the same sample in a direction perpendicular to the sample surface. As shown in FIG. 26B, a ring-like diffraction pattern is observed. Thus, the electron diffraction also indicates that the a-axes and b-axes of the pellets included in the CAAC-OS do not have regular alignment. The first ring in FIG. 26B is considered to be derived from the (010) plane, the (100) plane, and the like of the $InGaZnO_4$ crystal. The second ring in FIG. 26B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane cannot be detected. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

A-LIKE OS

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 27:
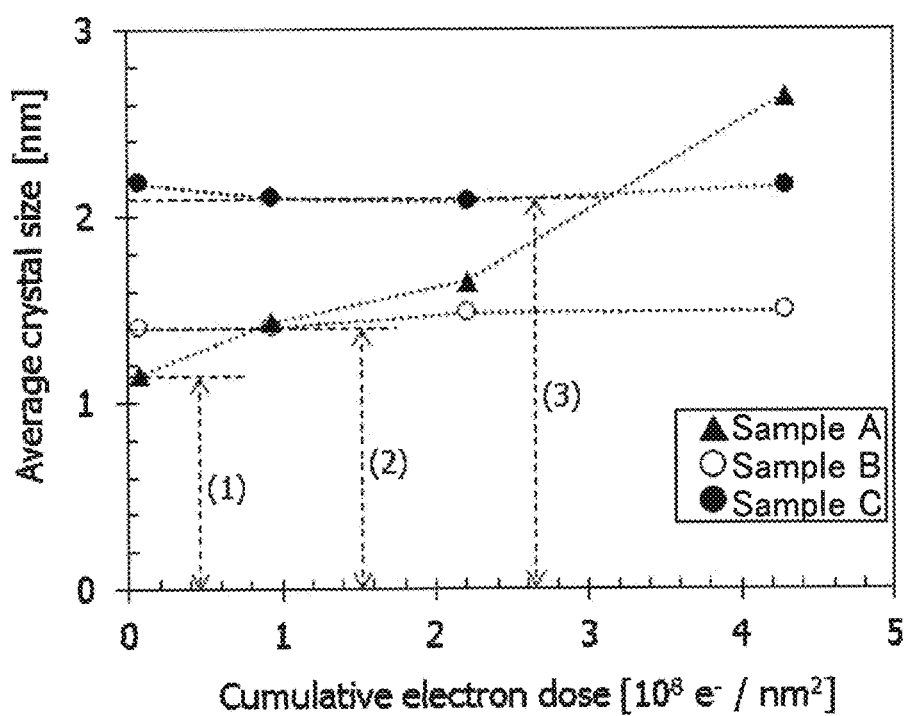
FIG. 27 shows a change in crystal part of an In—Ga—Zn oxide induced by electron irradiation.

FIG. 27 shows change in the average size of crystal parts (at 22 points to 45 points) in each sample. Note that the crystal part size corresponds to the length of a lattice fringe. FIG. 27 indicates that the crystal part size in the a-like OS increases with an increase in the cumulative electron dose. Specifically, as shown by (1) in FIG. 27, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 14, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 3

In this embodiment, an example of a circuit of a semiconductor device including a transistor or the like of one embodiment of the present invention is described.

CMOS INVERTER

Figure 28A:
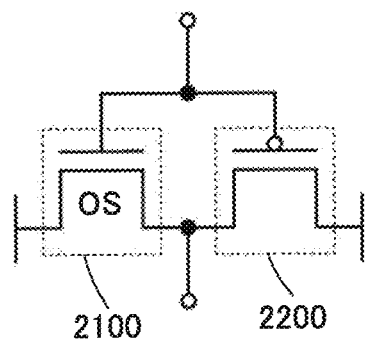
FIGS. 28A and 28B are each a circuit diagram illustrating a semiconductor device of one embodiment of the present invention.

A circuit diagram in FIG. 28A shows a configuration of a so-called CMOS inverter in which a p-channel transistor 2200 and an n-channel transistor 2100 are connected to each other in series and in which gates of them are connected to each other.

STRUCTURE 1 OF SEMICONDUCTOR DEVICE

Figure 29:
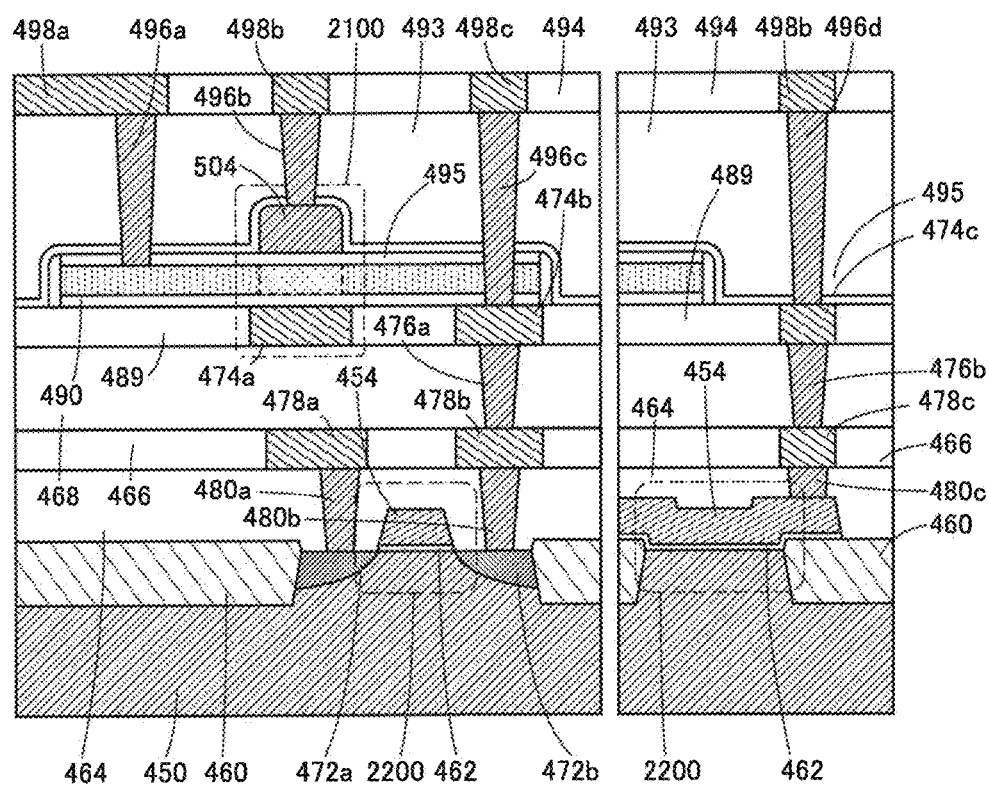
FIG. 29 is a cross-sectional view illustrating a semiconductor device of one embodiment of the present invention.

FIG. 29 is a cross-sectional view of the semiconductor device of FIG. 28A. The semiconductor device shown in FIG. 29 includes the transistor 2200 and the transistor 2100. The transistor 2100 is placed above the transistor 2200. Any of the transistors described in the above embodiments can be used as the transistor 2100. Therefore, the description regarding the above-mentioned transistors is referred to for the transistor 2100 as appropriate.

The transistor 2200 shown in FIG. 29 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 29 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 489, an insulator 490, an insulator 492, an insulator 493, an insulator 494, and an insulator 495.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 493 is placed over the transistor 2100. The insulator 494 is placed over the insulator 493.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 504 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable. Note that the conductor 474a corresponds to the conductor 160 in the above embodiment and thus, the description of the conductor 160 can be referred to for details about the conductor 474a.

The insulator 490 includes an opening reaching the conductor 474b and an opening reaching the conductor 474c. Note that the insulator 490 corresponds to the insulator 120 in the above embodiment and thus, the description of the insulator 120 can be referred to for details about the insulator 490.

The insulator 495 includes an opening reaching the conductor 474b through a region 507b that is one of a source and a drain of the transistor 2100, an opening reaching a region 507a that is the other of the source and the drain of the transistor 2100, an opening reaching the conductor 504 that is the gate electrode of the transistor 2100, and an opening reaching the conductor 474c. Note that the insulator 495 corresponds to the insulator 150 in the above embodiment and thus, the description of the insulator 150 can be referred to for details about the insulator 495.

The insulator 493 includes an opening reaching the conductor 474b through the region 507b that is the one of the source and the drain of the transistor 2100, an opening reaching the region 507a that is the other of the source and the drain of the transistor 2100, an opening reaching the conductor 504 that is the gate electrode of the transistor 2100, and an opening reaching the conductor 474*c*. In the openings, the conductor 496*a*, the conductor 496*b*, the conductor 496*c*, and the conductor 496*d* are embedded. Note that in some cases, an opening provided in a component of the transistor 2100 or the like is positioned between openings provided in other components.

The insulator 494 includes an opening reaching the conductor 496*a*, an opening reaching the conductor 496*b* and the conductor 496*d*, and an opening reaching the conductor 496*c*. In the openings, the conductor 498*a*, the conductor 498*b*, and the conductor 498*c* are embedded.

The insulators 464, 466, 468, 489, 493, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, 489, 493, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480*a*, the conductor 480*b*, the conductor 480*c*, the conductor 478*a*, the conductor 478*b*, the conductor 478*c*, the conductor 476*a*, the conductor 476*b*, the conductor 474*a*, the conductor 474*b*, the conductor 474*c*, the conductor 496*a*, the conductor 496*b*, the conductor 496*c*, the conductor 496*d*, the conductor 498*a*, the conductor 498*b*, and the conductor 498*c* may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 30:
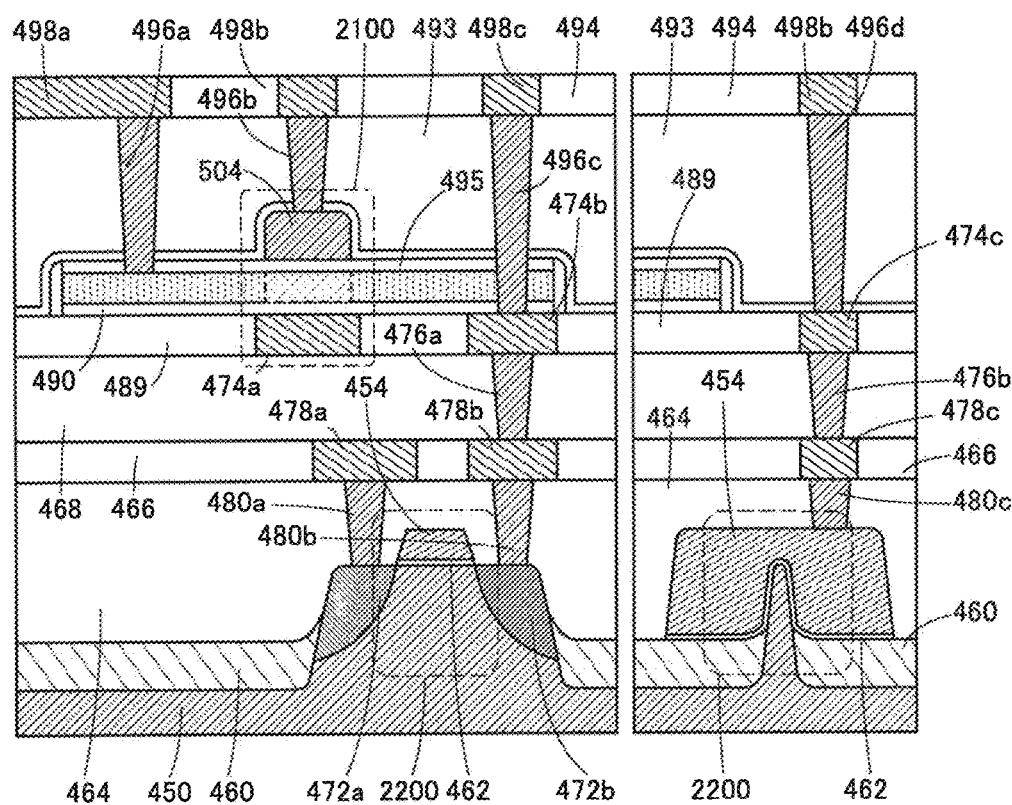
FIG. 30 is cross-sectional view illustrating a semiconductor device of one embodiment of the present invention.

Note that a semiconductor device in FIG. 30 is the same as the semiconductor device in FIG. 29 except the structure of the transistor 2200. Therefore, the description of the semiconductor device in FIG. 29 is referred to for the semiconductor device in FIG. 30. In the semiconductor device in FIG. 30, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 31:
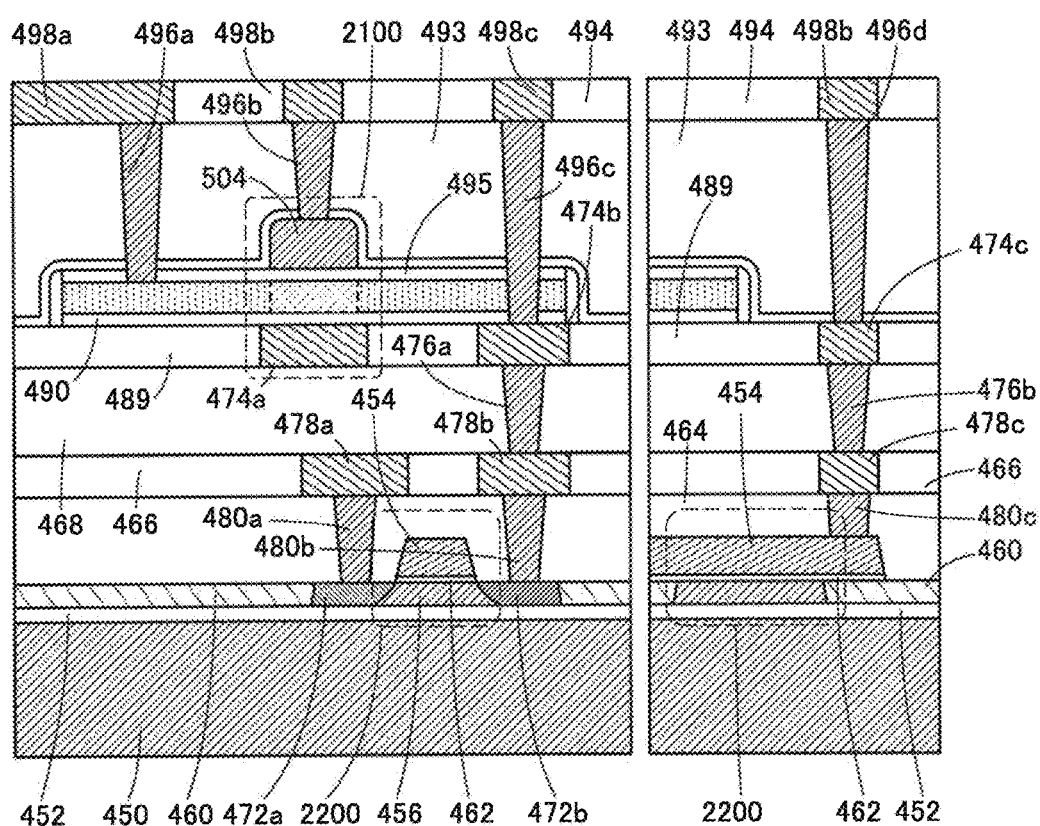
FIG. 31 is cross-sectional view illustrating a semiconductor device of one embodiment of the present invention.

Note that a semiconductor device in FIG. 31 is the same as the semiconductor device in FIG. 29 except the structure of the transistor 2200. Therefore, the description of the semiconductor device in FIG. 29 is referred to for the semiconductor device in FIG. 31. Specifically, in the semiconductor device in FIG. 31, the transistor 2200 is formed in the semiconductor substrate 450 that is an SOI substrate. In the structure in FIG. 31, a region 456 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 29, FIG. 30, and FIG. 31, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

CMOS ANALOG SWITCH

Figure 28B:
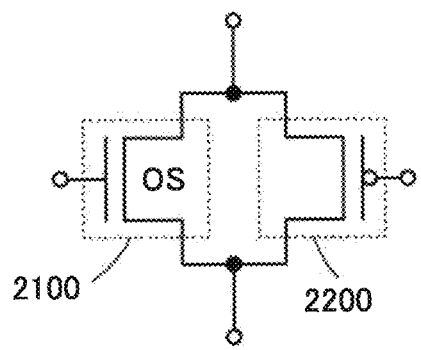

A circuit diagram in FIG. 28B shows a configuration in which sources of the transistors 2100 and 2200 are connected to each other and drains of the transistors 2100 and 2200 are connected to each other. With such a configuration, the transistors can function as a so-called CMOS analog switch.

MEMORY DEVICE 1

Figure 32A:
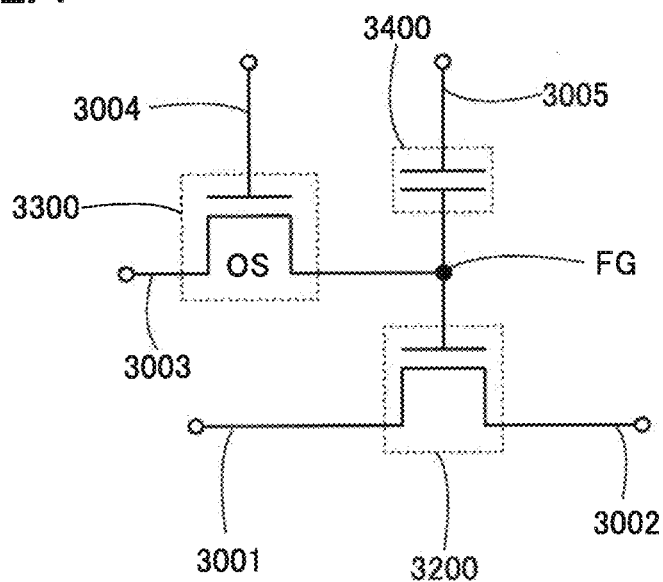
FIGS. 32A and 32B are circuit diagrams each illustrating a memory device of one embodiment of the present invention.
Figure 32B:
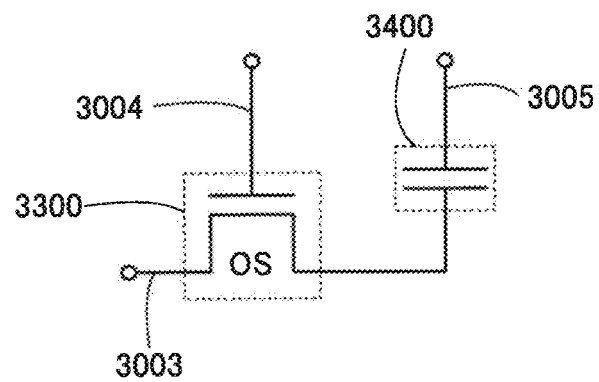

An example of a semiconductor device (memory device) which includes the transistor of one embodiment of the present invention, which can retain stored data even when not powered, and which has an unlimited number of write cycles is shown in FIGS. 32A and 32B.

The semiconductor device illustrated in FIG. 32A includes a transistor 3200 using a first semiconductor, a transistor 3300 using a second semiconductor, and a capacitor 3400. Note that a transistor similar to the above-described transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 32A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 32A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charges providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into "on state." In the case where the low-level electric charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an "off state" regardless of the charge supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into an "on state" regardless of the charge supplied to the node FG, that is, a potential higher than $V_{th\_L}$ to the fifth wiring 3005 of memory cells from which data is not read may be employed.

Although an example in which two kinds of electric charges are retained in the node FG, the semiconductor device of the present invention is not limited to this example. For example, a structure in which three or more kinds of electric charges can be retained in the node FG of the semiconductor device may be employed. With such a structure, the semiconductor device can be multi-valued and the storage capacity can be increased.

STRUCTURE 1 OF MEMORY DEVICE

Figure 33:
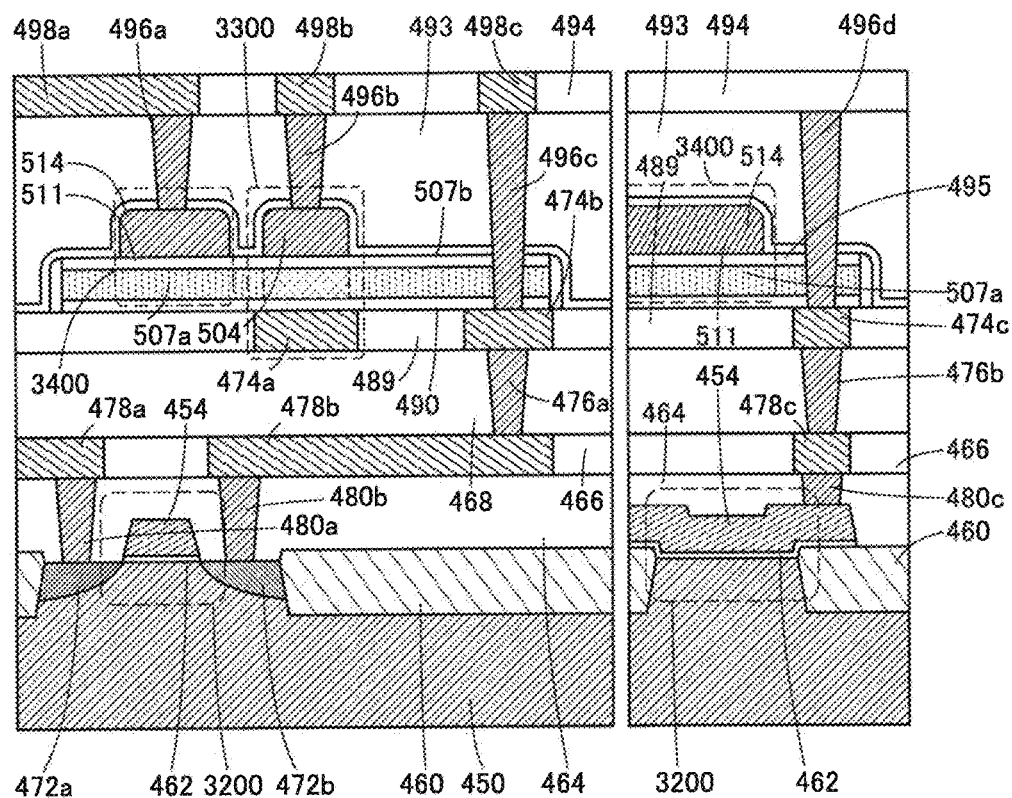
FIG. 33 is a cross-sectional view illustrating a semiconductor device of one embodiment of the present invention.

FIG. 33 is a cross-sectional view of the semiconductor device of FIG. 32A. The semiconductor device shown in FIG. 33 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 29 is referred to. Note that although the transistor 2200 is illustrated as a p-channel transistor in FIG. 29, the transistor 3200 may be an n-channel transistor.

The transistor 2200 illustrated in FIG. 33 is a transistor using a semiconductor substrate 450. The transistor 2200 includes a region 472a in the semiconductor substrate 450, a region 472b in the semiconductor substrate 450, an insulator 462, and a conductor 454.

The semiconductor device illustrated in FIG. 33 includes insulators 464, 466, and 468, conductors 480a, 480b, 480c, 478a, 478b, 478c, 476a, 476b, 474a, 474b, 474c, 496a, 496b, 496c, 496d, 498a, 498b, and 498c, and the insulators 489, 490, 492, 493, 494, and 495.

The insulator 464 is provided over the transistor 3200. The insulator 466 is provided over the insulator 464. The insulator 468 is provided over the insulator 466. The insulator 489 is provided over the insulator 468. The transistor 2100 is provided over the insulator 489. The insulator 493 is provided over the transistor 2100. The insulator 494 is provided over the insulator 493.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 489 includes an opening overlapping with the channel formation region of the transistor 3300, an opening reaching the conductor 476a, and an opening reaching the conductor 476b. In the openings, the conductor 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a constant potential to the conductor 474a. Further alternatively, for example, the conductor 474a and the conductor 504 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 490 includes an opening reaching the conductor 474b and an opening reaching the conductor 474c. Note that the insulator 490 corresponds to the insulator 120 in the above embodiment and thus, the description of the insulator 120 can be referred to for details about the insulator 490.

The insulator 495 includes an opening reaching the conductor 474b through the region 507b that is one of a source and a drain of the transistor 3300, an opening reaching the conductor 514 that overlaps with the region 507a that is the other of the source and the drain of the transistor 3300, with the insulator 511 positioned therebetween, an opening reaching the conductor 504 that is a gate electrode of the transistor 3300, and an opening reaching the conductor 474c through the region 507a that is the other of the source and the drain of the transistor 3300. Note that the insulator 495 corresponds to the insulator 150 in the above embodiment and thus, the description of the insulator 150 can be referred to for details about the insulator 495.

The insulator 493 includes an opening reaching the conductor 474b through the region 507b that is one of a source and a drain of the transistor 3300, an opening reaching the conductor 514 that overlaps with the region 507a that is the other of the source and the drain of the transistor 3300, with the insulator 511 positioned therebetween, an opening reaching the conductor 504 that is a gate electrode of the transistor 3300, and an opening reaching the conductor 474c through the region 507a that is the other of the source and the drain of the transistor 3300. In the openings, the conductor 496a, the conductor 496b, the conductor 496c, and the conductor 496d are embedded. Note that in some cases, an opening provided in a component of the transistor 3300 or the like is positioned between openings provided in other components.

The insulator 494 includes an opening reaching the conductor 496a, an opening reaching the conductor 496b, and an opening reaching the conductor 496c. In the openings, the conductors 498a, 498b, and 498c are embedded.

At least one of the insulators 464, 466, 468, 489, 493, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The source or drain of the transistor 3200 is electrically connected to the region 507b that is one of a source and a drain of the transistor 3300 through the conductor 480b, the conductor 478b, the conductor 476a, the conductor 474b, and the conductor 496c. The conductor 454 that is the gate electrode of the transistor 3200 is electrically connected to the region 507a that is the other of the source and the drain of the transistor 3300 through the conductor 480c, the conductor 478c, the conductor 476b, the conductor 474c, and the conductor 496d.

The capacitor 3400 includes the region 507a that is the other of the source and the drain of the transistor 3300, the conductor 514, and an insulator 511. The insulator 511 is preferably used in some cases because the insulator 511 can be formed in the same step as the insulator serving as a gate insulator of the transistor 3300, leading to an increase in productivity. A layer formed in the same step as the conductor 504 serving as a gate electrode of the transistor 3300 is preferably used as the conductor 514 in some cases, leading to an increase in productivity.

For the structures of other components, the description of FIG. 29 and the like can be referred to as appropriate.

Figure 34:
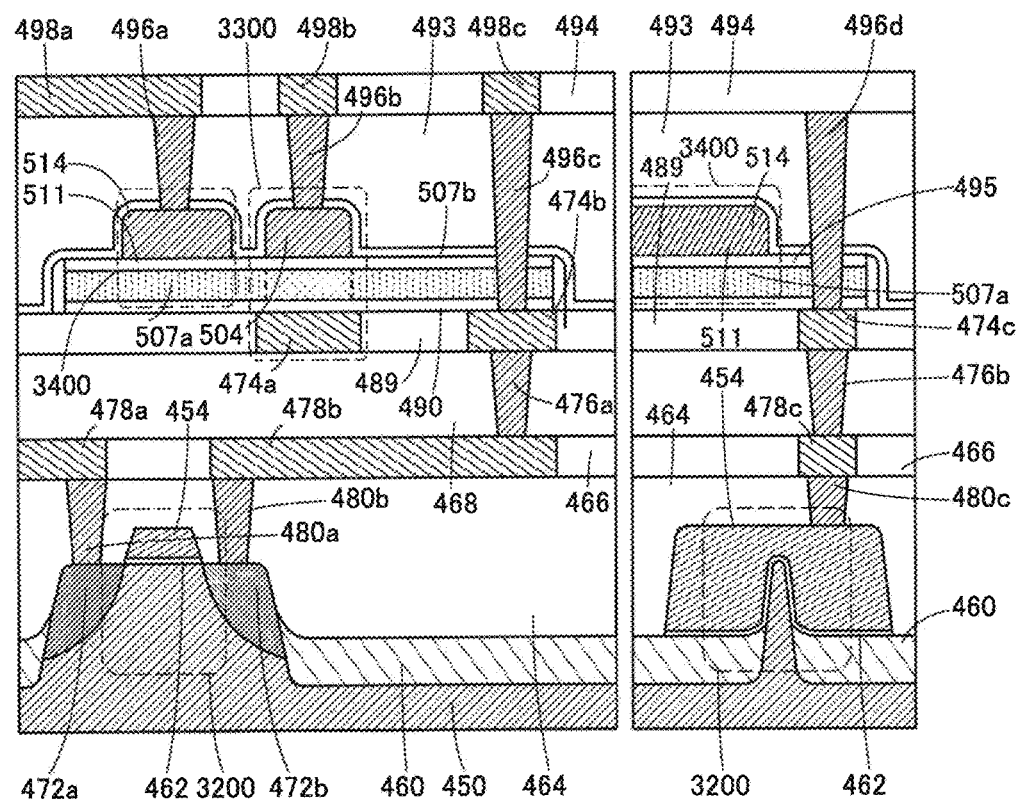
FIG. 34 is a cross-sectional view illustrating a semiconductor device of one embodiment of the present invention.

A semiconductor device in FIG. 34 is the same as the semiconductor device in FIG. 33 except the structure of the transistor 3200. Therefore, the description of the semiconductor device in FIG. 33 is referred to for the semiconductor device in FIG. 34. Specifically, in the semiconductor device in FIG. 34, the transistor 3200 is a Fin-type transistor. For the Fin-type transistor 3200, the description of the transistor 2200 in FIG. 30 is referred to. Note that although the transistor 2200 is illustrated as a p-channel transistor in FIG. 30, the transistor 3200 may be an n-channel transistor.

Figure 35:
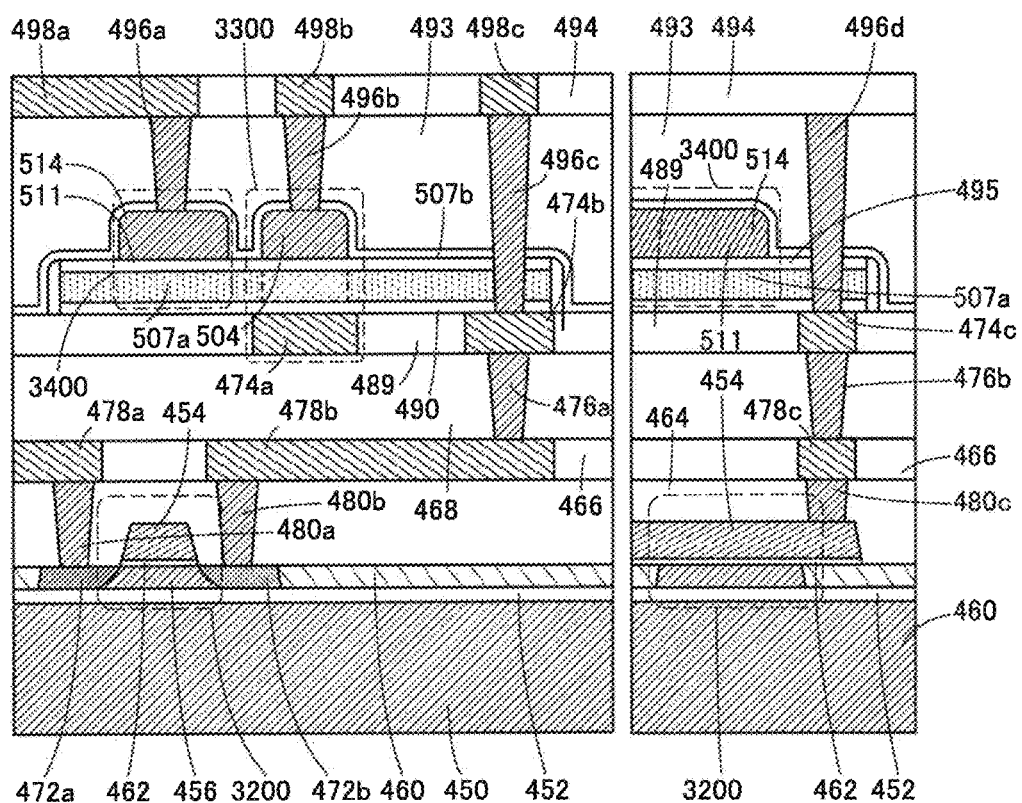
FIG. 35 is a cross-sectional view illustrating a semiconductor device of one embodiment of the present invention.

A semiconductor device in FIG. 35 is the same as the semiconductor device in FIG. 33 except a structure of the transistor 3200. Therefore, the description of the semiconductor device in FIG. 33 is referred to for the semiconductor device in FIG. 35. Specifically, in the semiconductor device in FIG. 35, the transistor 3200 is provided in the semiconductor substrate 450 that is an SOI substrate. For the transistor 3200, which is provided in the semiconductor substrate 450 that is an SOI substrate, the description of the transistor 2200 in FIG. 31 is referred to. Note that although the transistor 2200 is illustrated as a p-channel transistor in FIG. 31, the transistor 3200 may be an n-channel transistor.

MEMORY DEVICE 2

The semiconductor device in FIG. 32B is different from the semiconductor device in FIG. 32A in that the transistor 3200 is not provided. Also in this case, data can be written and retained in a manner similar to that of the semiconductor device in FIG. 32A.

Reading of data in the semiconductor device in FIG. 32B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

MEMORY DEVICE 3

A modification example of the semiconductor device (memory device) illustrated in FIG. 32A is described with reference to a circuit diagram in FIG. 36.

Figure 36:
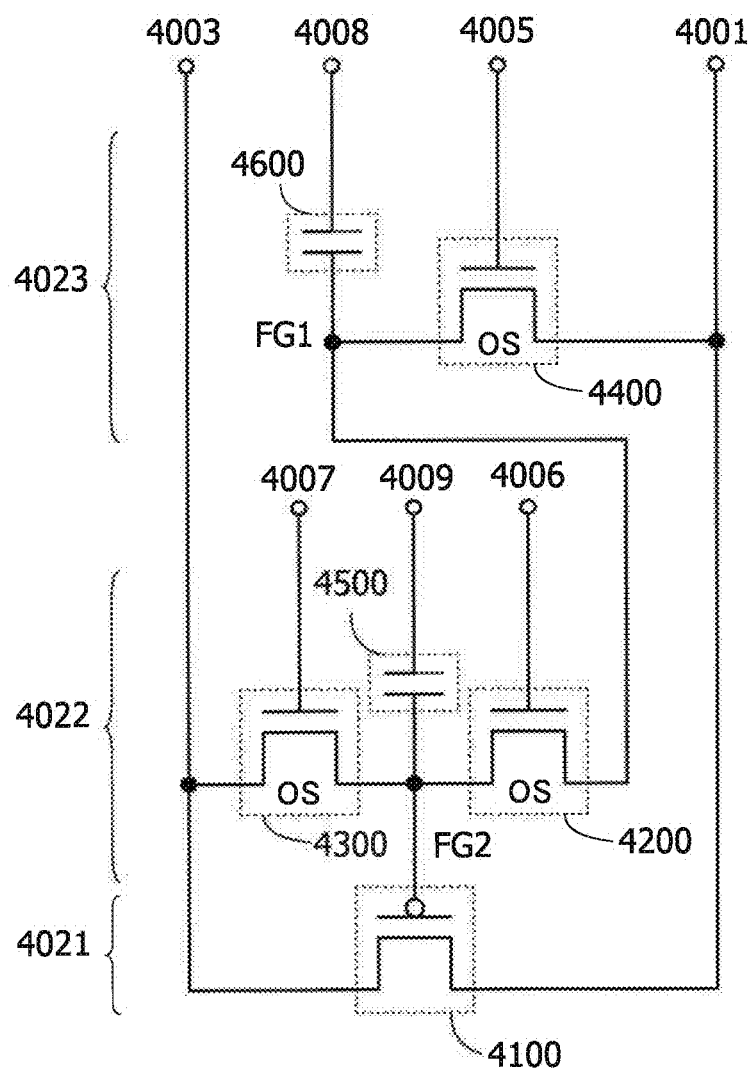
FIG. 36 is a circuit diagram illustrating a semiconductor device of one embodiment of the present invention.

The semiconductor device illustrated in FIG. 36 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 36, a plurality of semiconductor devices in FIG. 36 are provided in a matrix. The semiconductor devices in FIG. 36 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 36, the transistor 4100 may be an n-channel transistor.

The semiconductor device in FIG. 36 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200 to 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200 to 4400 are n-channel transistors in FIG. 36, the transistors 4200, 4300, and 4400 may be p-channel transistors.

The transistors 4200 and 4300 and the transistor 4400 are preferably provided in different layers even when the transistors 4200, 4300, and 4400 are transistors including oxide semiconductors. In other words, the semiconductor device in FIG. 36 preferably includes, as illustrated in FIG. 36, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 36 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 36, after data voltages are written to the plurality of data retention portions, the wiring 4009 is set at the high level, so that the potentials of the nodes FG1 and FG2 are increased. Then, the transistors are turned off to stop movement of electric charges; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 36 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 36, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 37:
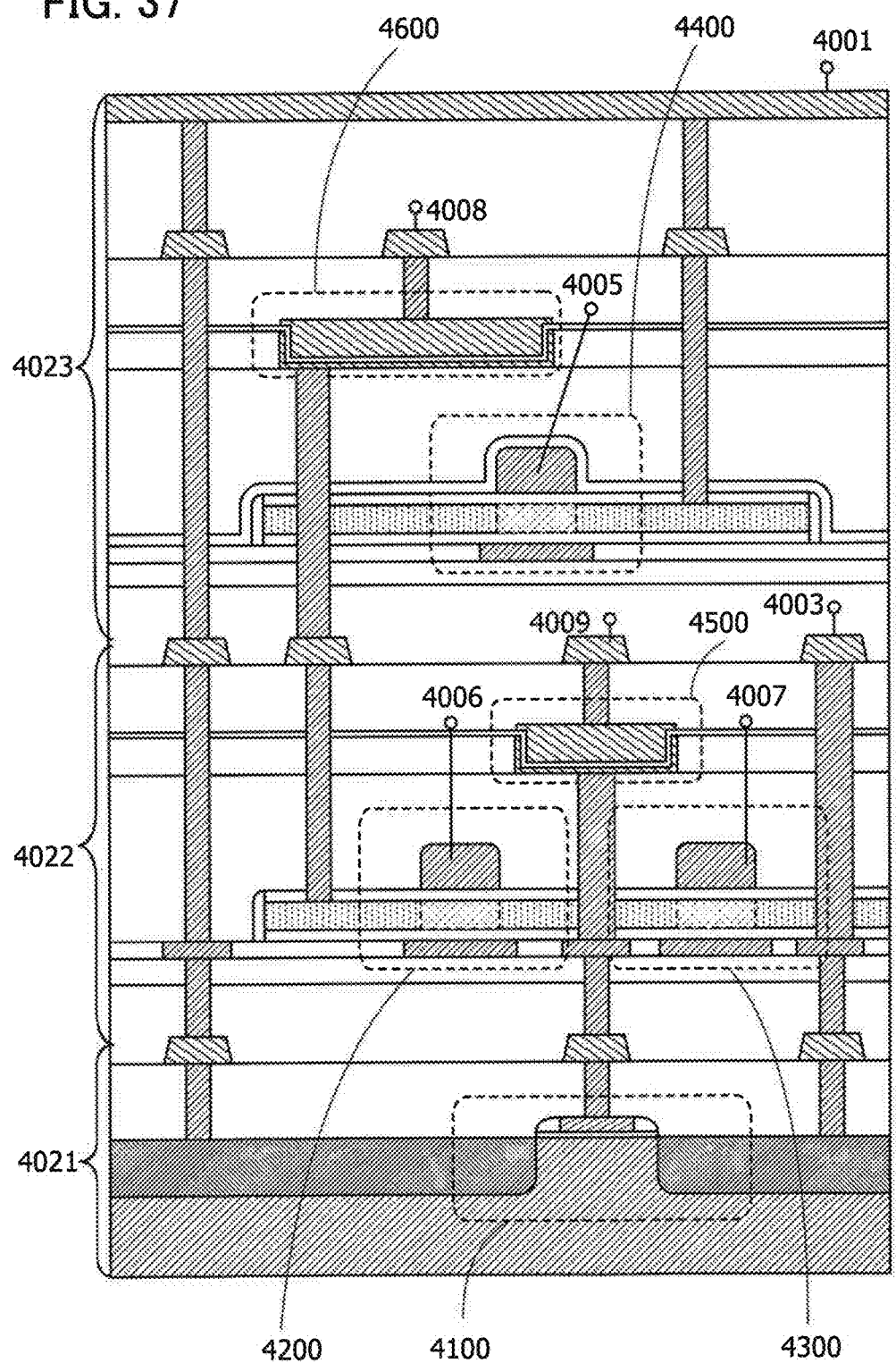
FIG. 37 is a cross-sectional view illustrating a semiconductor device of one embodiment of the present invention.

FIG. 37 is a cross-sectional view of a semiconductor device that corresponds to FIG. 36. The semiconductor device illustrated in FIG. 37 includes the transistors 4100 to 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200 to 4400, and the description of the transistor 3200 can be referred to for the transistor 4100. The description made with reference to FIG. 33 can be appropriately referred to for other wirings, other insulators, and the like.

Note that the capacitors 4500 and 4600 in FIG. 37 are formed by including the conductive layers each having a trench-like shape, while the conductive layer of the capacitor 3400 in the semiconductor device in FIG. 33 is parallel to the substrate. With this structure, a larger capacity can be obtained without increasing the occupation area.

FPGA

One embodiment of the present invention can also be applied to an LSI such as a field programmable gate array (FPGA).

Figure 38A:
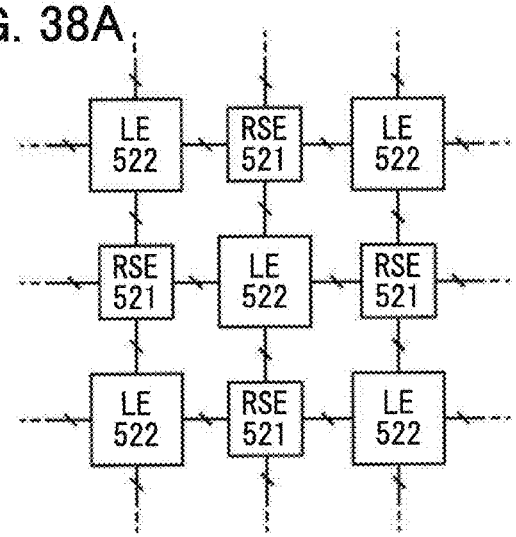
FIGS. 38A to 38E are circuit diagrams illustrating a semiconductor device of one embodiment of the present invention.

FIG. 38A illustrates an example of a block diagram of an FPGA. The FPGA includes a routing switch element 521 and a logic element 522. The logic element 522 can switch functions of a logic circuit, such as a combination circuit or a sequential circuit, in accordance with configuration data stored in a configuration memory.

Figure 38B:
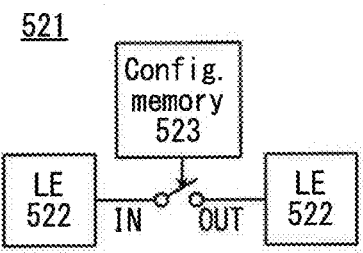

FIG. 38B is a schematic view illustrating a function of the routing switch element 521. The routing switch element 521 can switch a connection between the logic elements 522 in accordance with configuration data stored in a configuration memory 523. Note that although FIG. 38B illustrates one switch which switches connection between a terminal IN and a terminal OUT, in an actual FPGA, a plurality of switches are provided between a plurality of the logic elements 522.

Figure 38C:
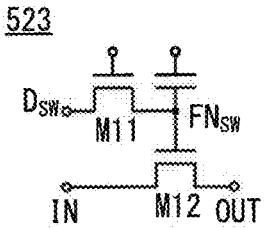

FIG. 38C illustrates an example of a configuration of a circuit serving as the configuration memory 523. The configuration memory 523 includes a transistor M11 that is an OS transistor and a transistor M12 that is a silicon transistor. Configuration data $D_{SW}$ is supplied to a node $FN_{SW}$ through the transistor M11. The potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 38D:
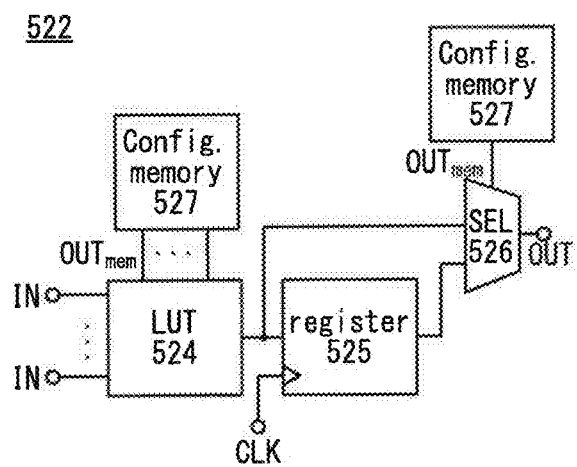

FIG. 38D is a schematic view illustrating a function of the logic element 522. The logic element 522 can switch a potential of a terminal $OUT_{mem}$ in accordance with configuration data stored in a configuration memory 527. A lookup table 524 can switch functions of a combination circuit that processes a signal of the terminal IN in accordance with the potential of the terminal $OUT_{mem}$. The logic element 522 includes a register 525 that is a sequential circuit and a selector 526 that switches signals of the terminal OUT. The selector 526 can select to output a signal of the lookup table 524 or to output a signal of the register 525 in accordance with the potential of the terminal $OUT_{mem}$, which is output from the configuration memory 527.

Figure 38E:
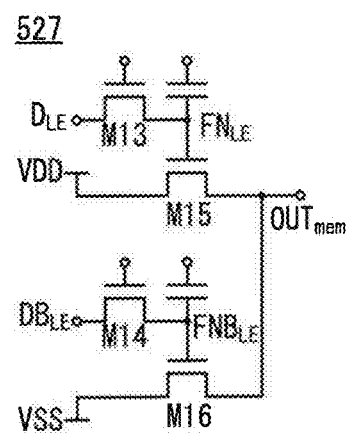

FIG. 38E illustrates an example of a configuration of a circuit serving as the configuration memory 527. The configuration memory 527 includes a transistor M13, a transistor M14, a transistor M15, and a transistor M16. The transistors M13 and M14 are OS transistors. The transistors M15 and M16 are silicon transistors. Configuration data $D_{LE}$ is supplied to a node $FN_{LE}$ through the transistor M13. Configuration data $DB_{LE}$ is supplied to a node $FNB_{LE}$ through the transistor M14. The configuration data $DB_{LE}$ corresponds to a potential of the configuration data $D_{LE}$ whose logic is inverted. The potential of the configuration data $D_{LE}$ and the potential of the configuration data $DB_{LE}$ can be retained by turning off the transistor M13 and the transistor M14, respectively. The on and off states of one of the transistors M15 and M16 are switched in accordance with the retained potential of the configuration data $D_{LE}$ or the configuration data $DB_{LE}$, so that a potential VDD or a potential VSS can be supplied to the terminal $OUT_{mem}$.

For the configuration illustrated in FIGS. 38A to 38E, any of the structures described in this embodiment can be used. For example, silicon transistors are used as the transistors M12, M15, and M16, and OS transistors are used as the transistors M11, M13, and M14. In this case, a wiring for connecting the Si transistors each provided in a lower layer to each other can be formed with a low-resistance conductive material. Therefore, a circuit with high access speed and low power consumption can be obtained.

The structure described in this embodiment can be used in appropriate combination with the structure described in any of the other embodiments.

Embodiment 4

In this embodiment, an example of an imaging device including the transistor or the like of one embodiment of the present invention will be described.

CONFIGURATION OF IMAGING DEVICE

Figure 39A:
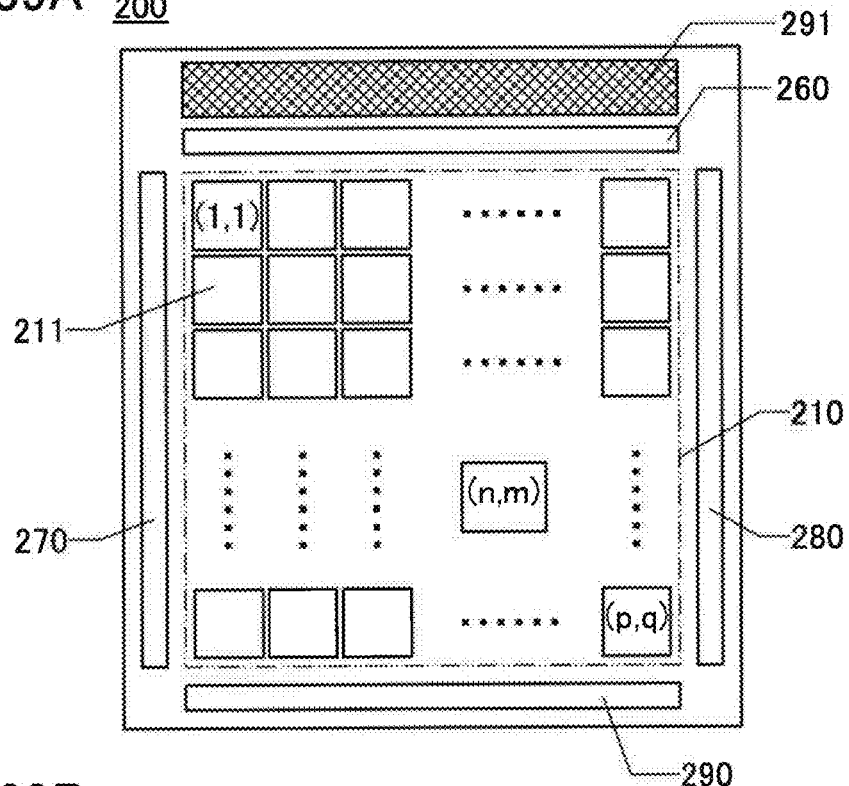
FIGS. 39A and 39B are top views each illustrating a semiconductor device of one embodiment of the present invention.

FIG. 39A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 39B:
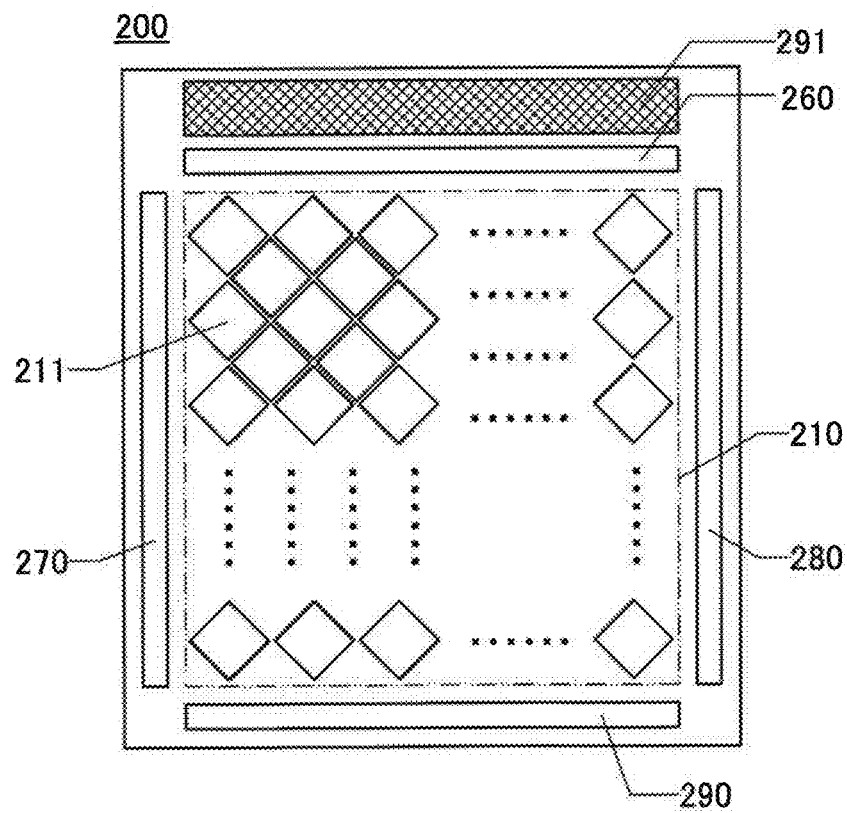

As illustrated in FIG. 39B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

CONFIGURATION EXAMPLE 1 OF PIXEL

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 40A:
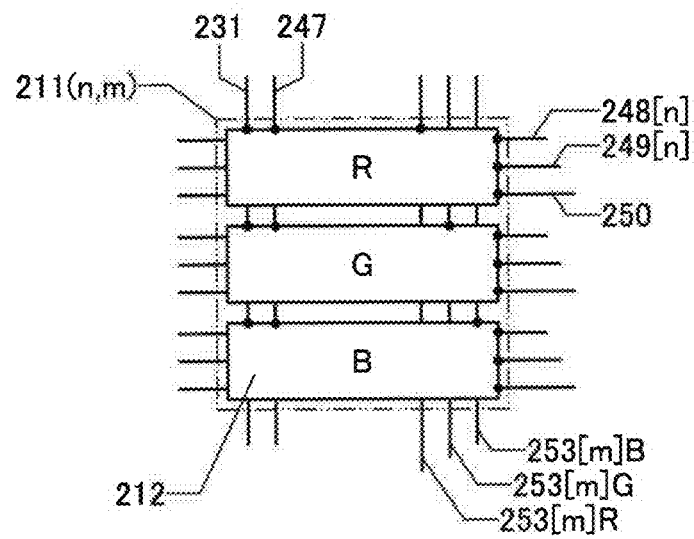
FIGS. 40A and 40B are block diagrams each illustrating a semiconductor device of one embodiment of the present invention.

FIG. 40A is a top view showing an example of the pixel 211 with which a color image is obtained. The pixel 211 illustrated in FIG. 40A includes a subpixel 212 provided with a color filter that transmits light in a red (R) wavelength range (also referred to as a subpixel 212R), a subpixel 212 provided with a color filter that transmits light in a green (G) wavelength range (also referred to as a subpixel 212G), and a subpixel 212 provided with a color filter that transmits light in a blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 40A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 40B:
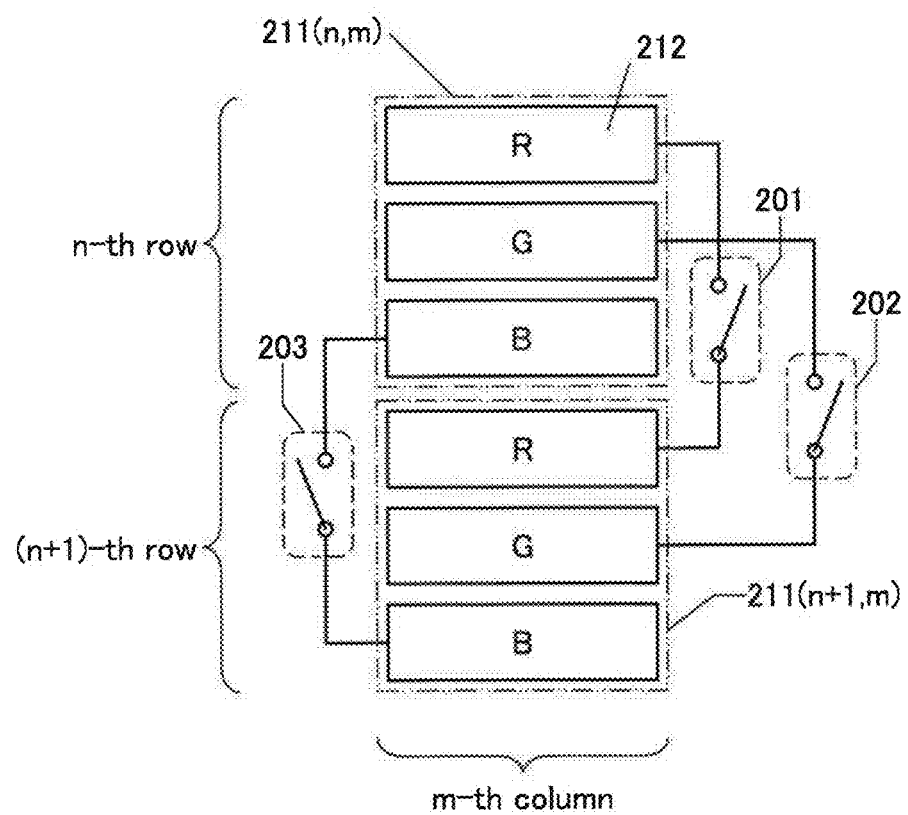

The imaging device 200 has a structure in which the subpixel 212 is electrically connected to the subpixel 212 in an adjacent pixel 211 which is provided with a color filter transmitting light in the same wavelength range as the subpixel 212, via a switch. FIG. 40B shows a connection example of the subpixels 212: the subpixel 212 in the pixel 211 arranged in the n-th (n is an integer greater than or equal to 1 and less than or equal top) row and the m-th (m is an integer greater than or equal to 1 and less than or equal to q) column and the subpixel 212 in the adjacent pixel 211 arranged in an (n+1)-th row and the m-th column. In FIG. 40B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 40A, in regard to the subpixel 212 sensing light in a red wavelength range, the subpixel 212 sensing light in a green wavelength range, and the subpixel 212 sensing light in a blue wavelength range, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 41A and 41B. With the lens 255, the photoelectric conversion element can receive incident light efficiently. Specifically, as illustrated in FIG. 41A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed double-dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 41B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 41A:
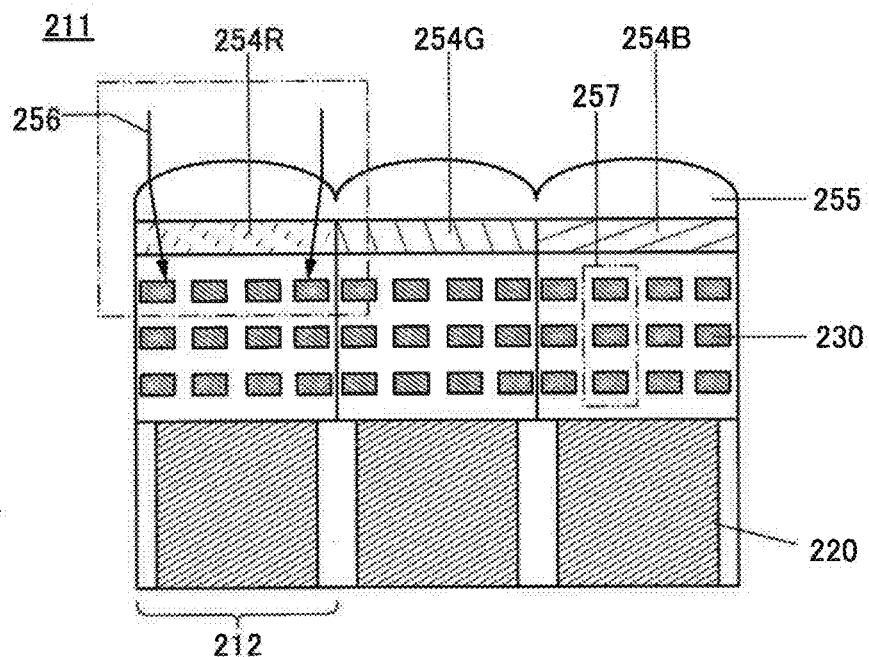
FIGS. 41A and 41B are cross-sectional views each illustrating a semiconductor device of one embodiment of the present invention.
Figure 41B:
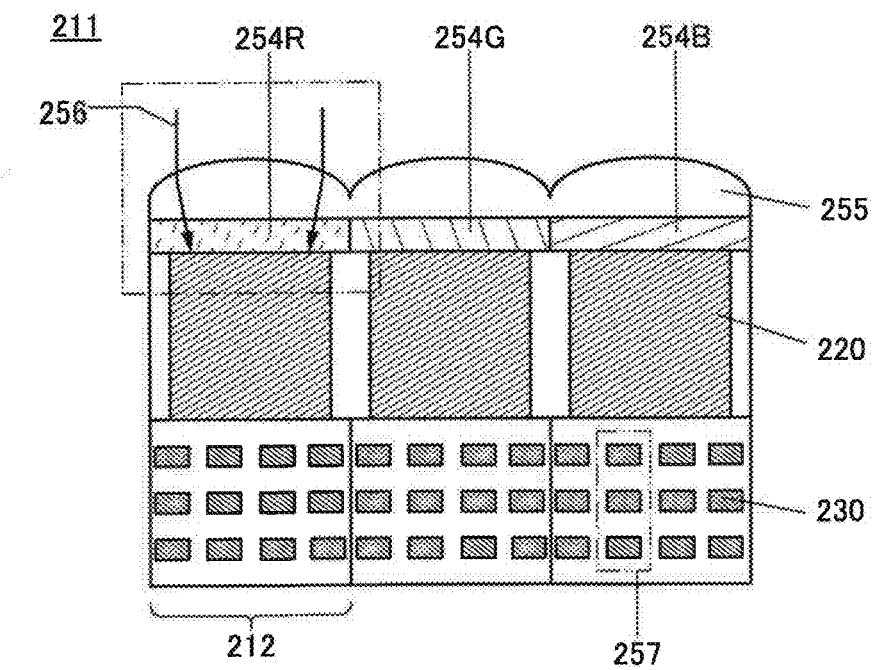

As the photoelectric conversion element 220 illustrated in FIGS. 41A and 41B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 40A and 40B.

CONFIGURATION EXAMPLE 2 OF PIXEL

An example of a pixel including a transistor using silicon and a transistor using an oxide semiconductor will be described below.

Figure 42A:
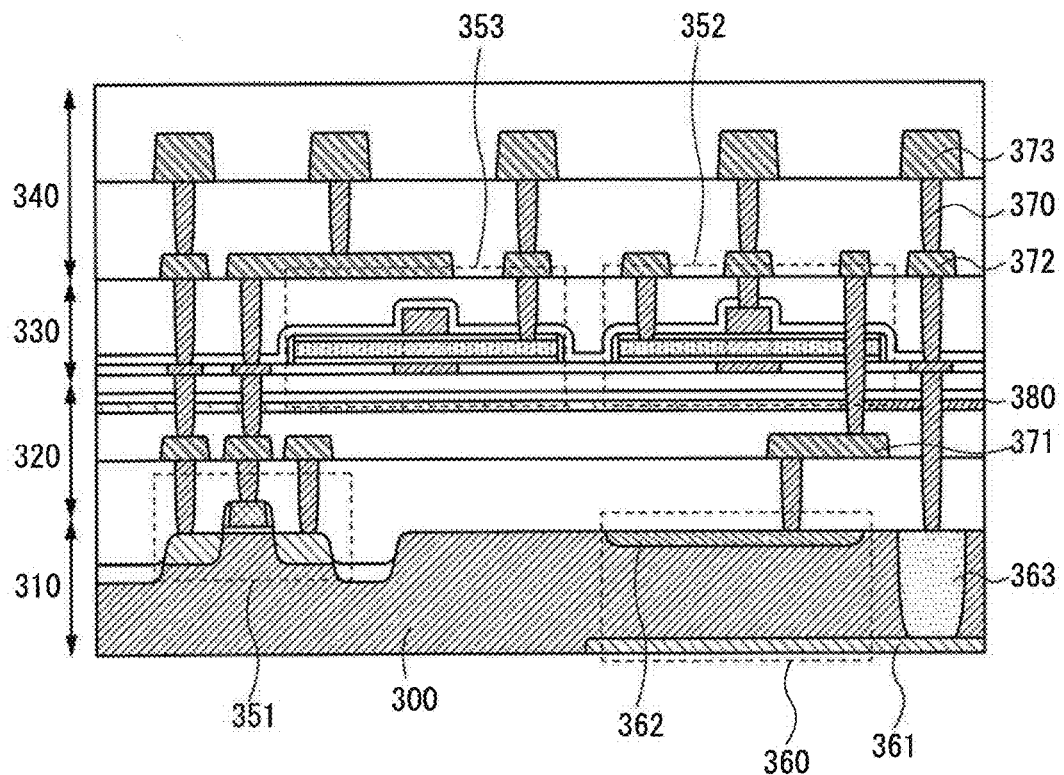
FIGS. 42A and 42B are cross-sectional views each illustrating a semiconductor device of one embodiment of the present invention.
Figure 42B:
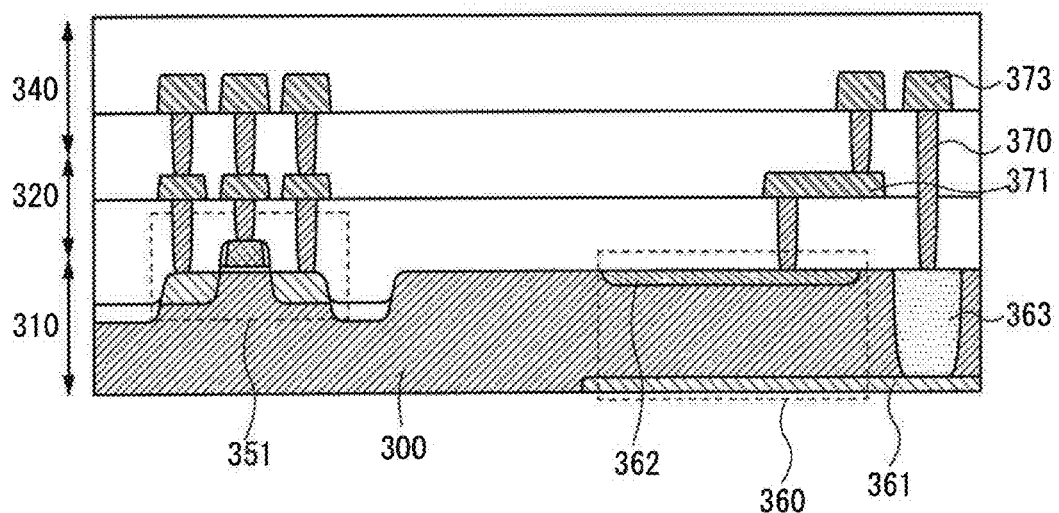

FIGS. 42A and 42B are each a cross-sectional view of an element included in an imaging device. The imaging device illustrated in FIG. 42A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 42A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 may be omitted. An example of a cross-sectional view in which the layer 330 is not provided is shown in FIG. 42B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 42A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIG. 43A1 and FIG. 43B1, part or the whole of the imaging device can be bent. FIG. 43A1 illustrates a state in which the imaging device is bent in the direction of a dashed-dotted line X1-X2. FIG. 43A2 is a cross-sectional view illustrating a portion indicated by the dashed-dotted line X1-X2 in FIG. 43A1. FIG. 43A3 is a cross-sectional view illustrating a portion indicated by a dashed-dotted line Y1-Y2 in FIG. 43A1.

FIG. 43B1 illustrates a state where the imaging device is bent in the direction of a dashed-dotted line X3-X4 and the direction of a dashed-dotted line Y3-Y4. FIG. 43B2 is a cross-sectional view illustrating a portion indicated by the dashed-dotted line X3-X4 in FIG. 43B1. FIG. 43B3 is a cross-sectional view illustrating a portion indicated by the dashed-dotted line Y3-Y4 in FIG. 43B1.

The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction of size or weight of electronic devices using the imaging device, and the like, can be achieved. In addition, the quality of a captured image can be improved.

The structures described in this embodiment can be used in appropriate combination with any of the structures described in the other embodiments.

Embodiment 5

In this embodiment, examples of CPUs including semiconductor devices such as the transistor of one embodiment of the present invention and the above-described memory device will be described.

CONFIGURATION OF CPU

Figure 44:
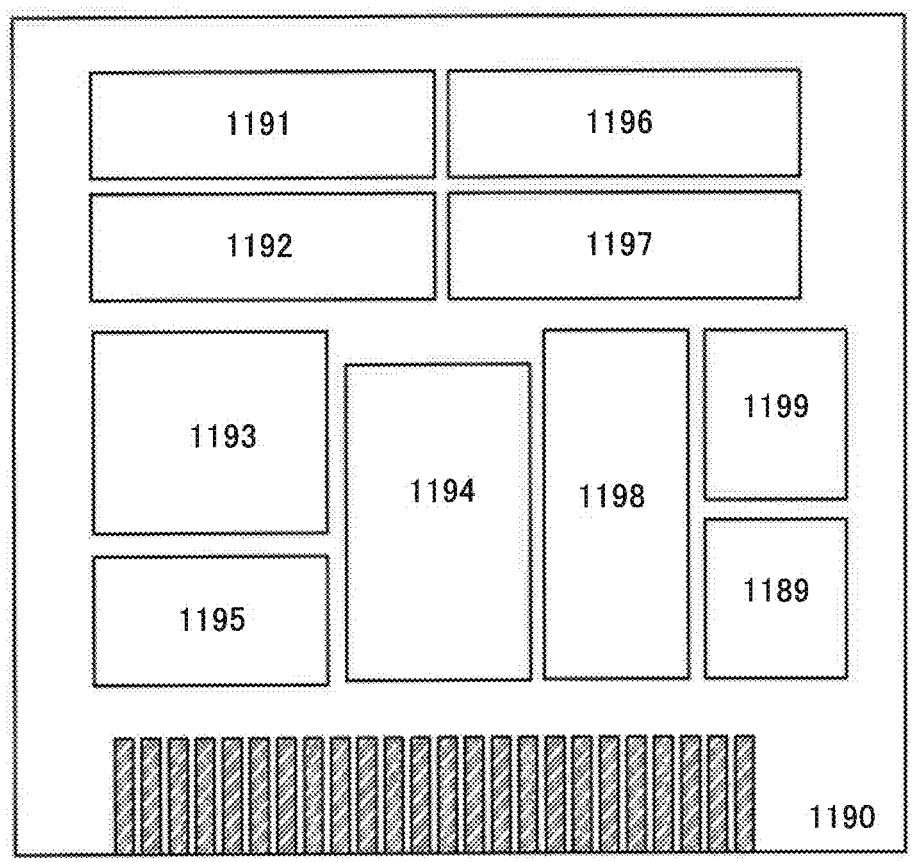
FIG. 44 is a block diagram illustrating a semiconductor device of one embodiment of the present invention.

FIG. 44 is a block diagram illustrating a configuration example of a CPU including any of the above-described transistors as a component.

The CPU illustrated in FIG. 44 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 44 is just an example in which the configuration has been simplified, and an actual CPU may have a variety of configurations depending on the application. For example, the CPU may have the following configuration: a structure including the CPU illustrated in FIG. 44 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 44, a memory cell is provided in the register 1196. For the memory cell of the register 1196, any of the above-described transistors, the above-described memory device, or the like can be used.

In the CPU illustrated in FIG. 44, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 45:
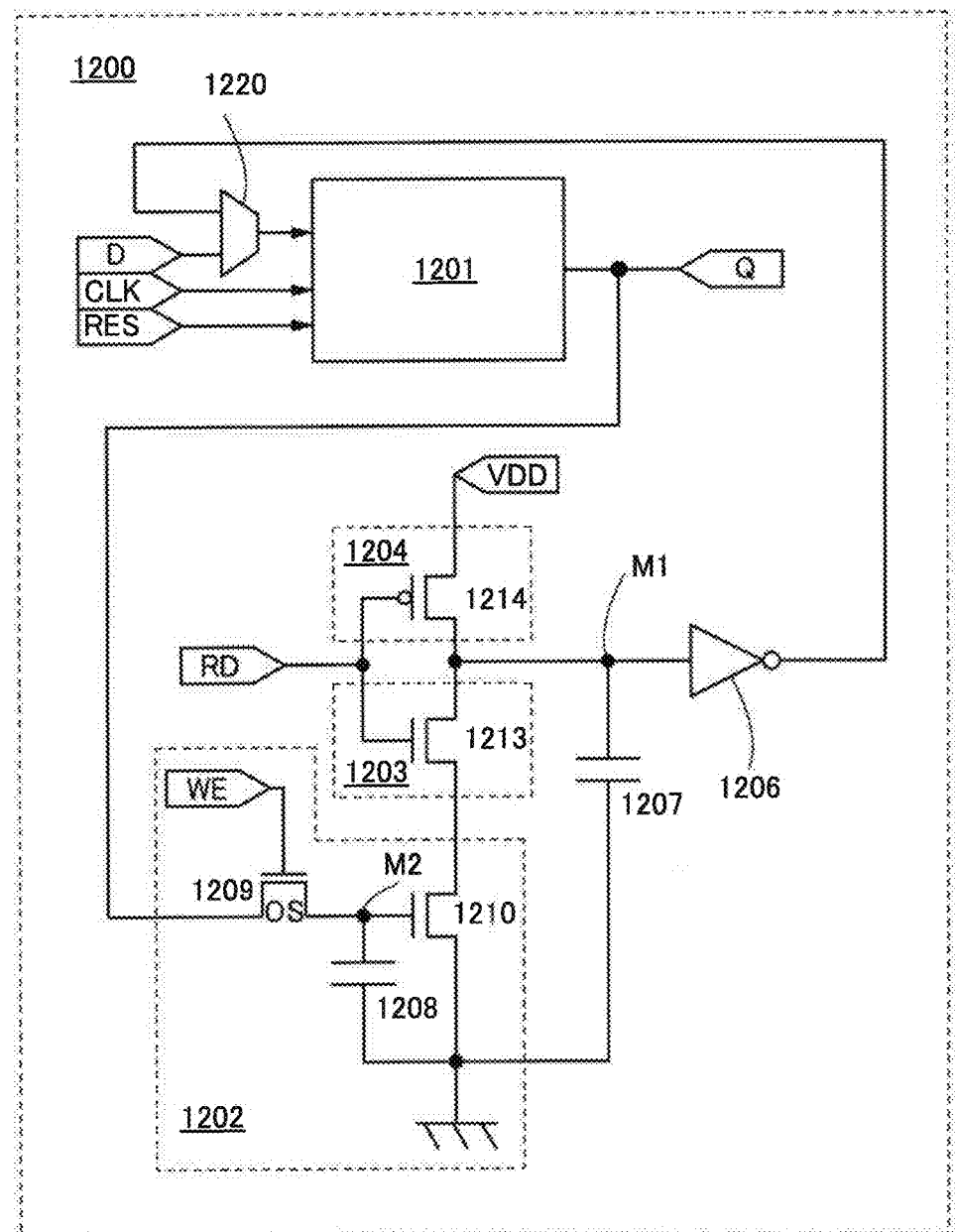
FIG. 45 is a circuit diagram illustrating a semiconductor device of one embodiment of the present invention.

FIG. 45 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 45 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 45, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 45, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 45, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP) or a custom LSI, and a radio frequency (RF) device. The memory element 1200 can also be used in an LSI such as a programmable logic circuit including a field programmable gate array (FPGA) or a complex programmable logic device (CPLD).

The structures described in this embodiment can be used in appropriate combination with any of the structures described in the other embodiments.

Embodiment 6

In this embodiment, display devices each including the transistor or the like of one embodiment of the present invention will be described with reference to FIGS. 46A to 46C and FIGS. 47A and 47B.

CONFIGURATION OF DISPLAY DEVICE

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 46A:
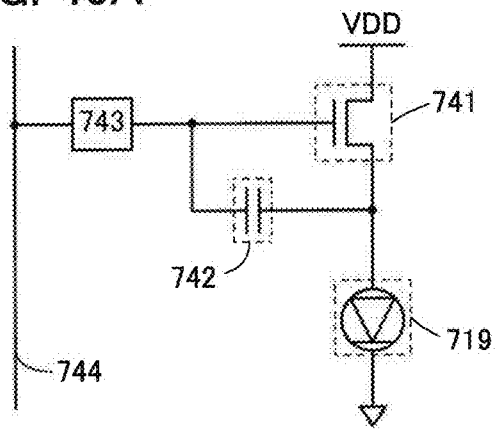
FIGS. 46A to 46C are a circuit diagram, a top view, and a cross-sectional view illustrating a semiconductor device of one embodiment of the present invention.
Figure 46B:
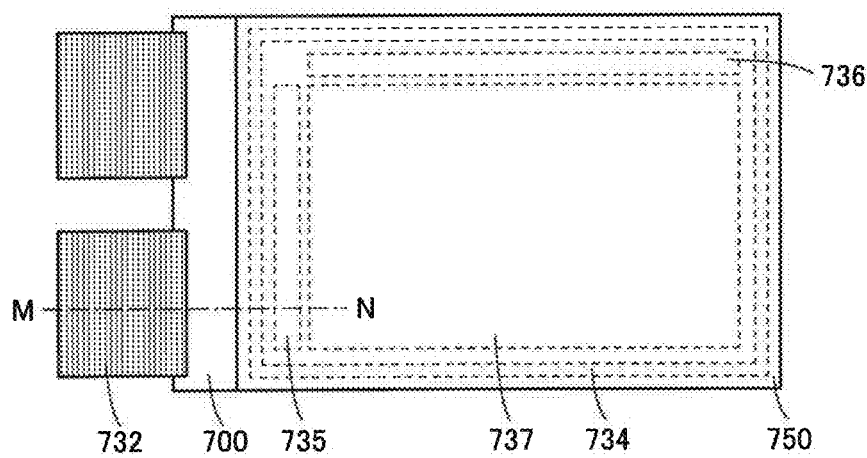
Figure 46C:
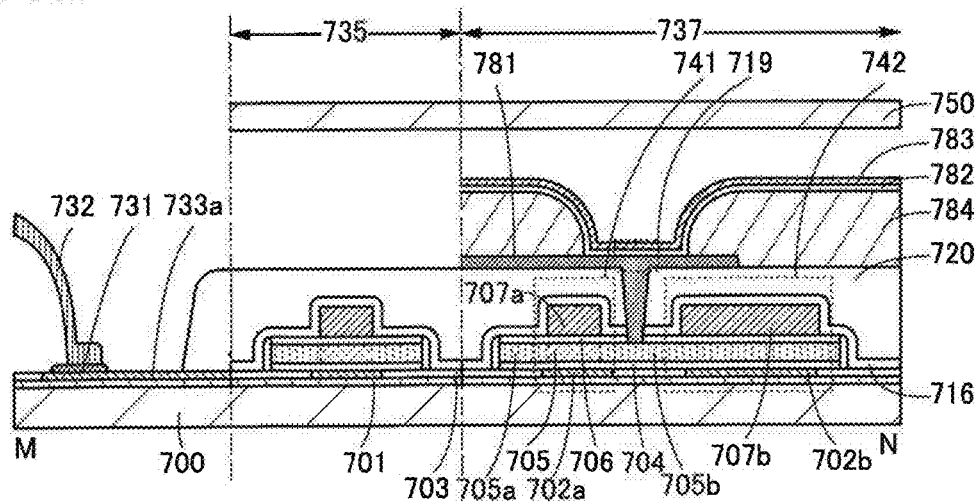

FIGS. 46A to 46C illustrate an example of an EL display device of one embodiment of the present invention. FIG. 46A is a circuit diagram of a pixel in an EL display device. FIG. 46B is a plan view showing the whole of the EL display device. FIG. 46C is a cross-sectional view taken along part of dashed-dotted line M-N in FIG. 46B.

FIG. 46A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 46A includes a switching element 743, a transistor 741, a capacitor 742, and a light-emitting element 719.

Note that FIG. 46A and the like each illustrate an example of a circuit structure; therefore, a transistor can be provided additionally. In contrast, for each node in FIG. 46A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 46B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 46C is a cross-sectional view of the EL display device taken along part of dashed-dotted line M-N in FIG. 46B.

The transistor 741 in FIG. 46C includes an insulator 701 over the substrate 700; a conductor 702a over the insulator 701; an insulator 703 in which the conductor 702a is embedded; an insulator 704 over the insulator 703; a semiconductor 705 over the insulator 704, in which a region 705a and a region 705b are provided; an insulator 706 over the semiconductor 705; and a conductor 707a over the insulator 706. Note that the structure of the transistor 741 is just an example; the transistor 741 may have a structure different from that illustrated in FIG. 46C.

In the transistor 741 illustrated in FIG. 46C, the conductor 702a serves as a gate electrode, the insulators 703 and 706 each serve as a gate insulator, the region 705a serves as a source, the region 705b serves as a drain, and the conductor 707a serves as a gate electrode. Note that in some cases, electrical characteristics of the semiconductor 705 change if light enters the semiconductor 705. To prevent this, it is preferable that one or more of the conductor 702a and the conductor 707a have a light-blocking property.

The capacitor 742 in FIG. 46C includes a conductor 702b over the insulator 701; the insulator 703 over the conductor 702b; the region 705b that is provided over the insulator 703 and overlaps with the conductor 702b; the insulator 706 over the region 705b; and the conductor 707b which is provided over the insulator 706 and overlaps with the region 705b.

In the capacitor 742, each of the conductor 702b and the region 705b functions as one electrode, and the conductor 707a functions as the other electrode.

Thus, the capacitor 742 can be formed using a film of the transistor 741. The conductor 702a and the conductor 702b are preferably conductors of the same kind, in which case the conductor 702a and the conductor 702b can be formed through the same step. Furthermore, the conductor 707a and the conductor 707b are preferably conductors of the same kind, in which case the conductor 707a and the conductor 707b can be formed through the same step.

The capacitor 742 illustrated in FIG. 46C has a large capacitance per area occupied by the capacitor. Therefore, the EL display device illustrated in FIG. 46C has high display quality.

An insulator 716 and an insulator 720 are provided over the transistor 741 and the capacitor 742. Here, the insulator 716 and the insulator 720 may have an opening portion reaching the region 705a that serves as the source of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another functions as the light-emitting element 719.

So far, examples of the EL display device are described. Next, an example of a liquid crystal display device is described.

Figure 47A:
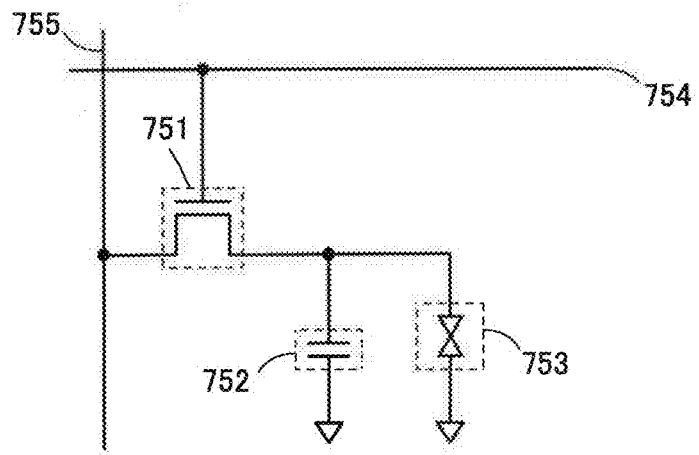
FIGS. 47A and 47B are a circuit diagram and a cross-sectional view illustrating a semiconductor device of one embodiment of the present invention.

FIG. 47A is a circuit diagram illustrating a configuration example of a pixel of a liquid crystal display device. A pixel shown in FIGS. 47A and 47B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 47B:
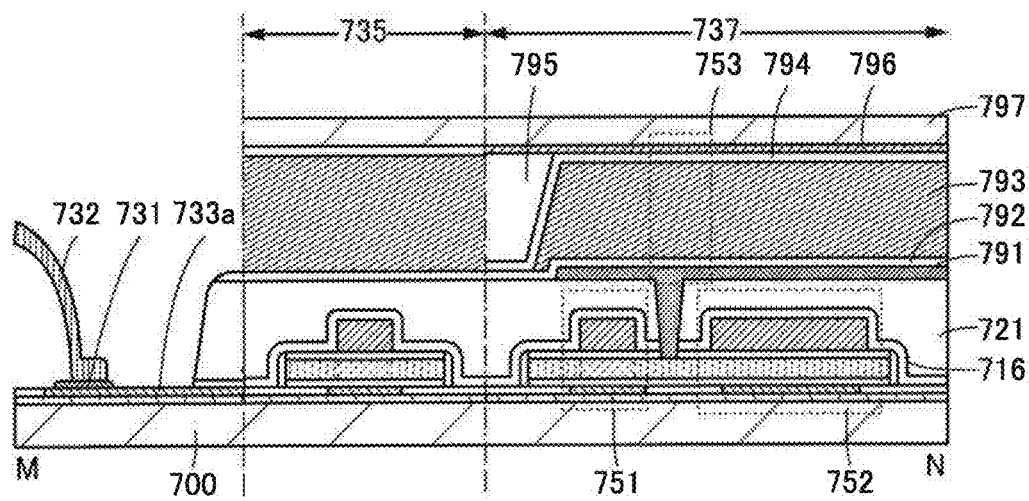

Note that the description of the liquid crystal display device is made on the assumption that the plan view of the liquid crystal display device is similar to that of the EL display device. FIG. 47B is a cross-sectional view of the liquid crystal display device taken along dashed-dotted line M-N in FIG. 46B. In FIG. 47B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 47B corresponds to, but is not limited to, the structure of the capacitor 742 in FIG. 46C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments.

Embodiment 7

In this embodiment, electronic devices each including the transistor or the like of one embodiment of the present invention will be described.

ELECTRONIC DEVICE

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 48A to 48F illustrate specific examples of these electronic devices.

Figure 48A:
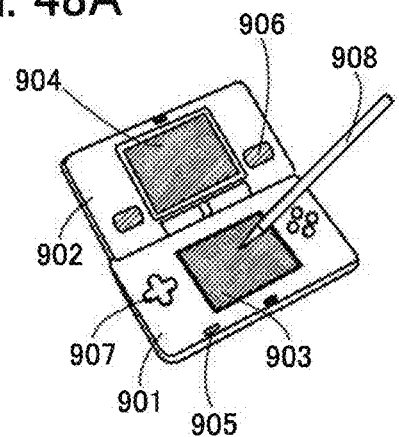
FIGS. 48A to 48F are perspective views each illustrating an electronic device of one embodiment of the present invention.

FIG. 48A illustrates a portable game console including a housing 901, a housing 902, a display portion 903, a display portion 904, a microphone 905, a speaker 906, an operation key 907, a stylus 908, and the like. Although the portable game console in FIG. 48A has the two display portions 903 and 904, the number of display portions included in a portable game console is not limited to this.

Figure 48B:
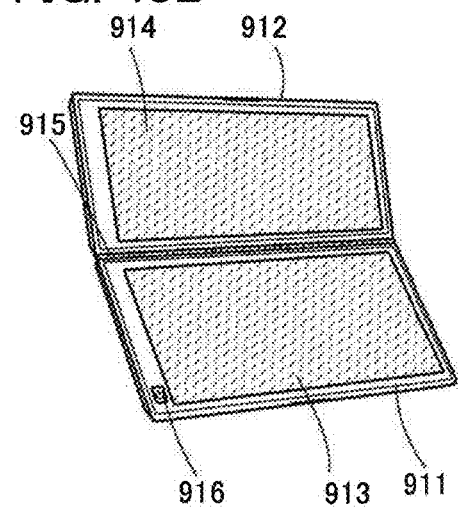

FIG. 48B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 48C:
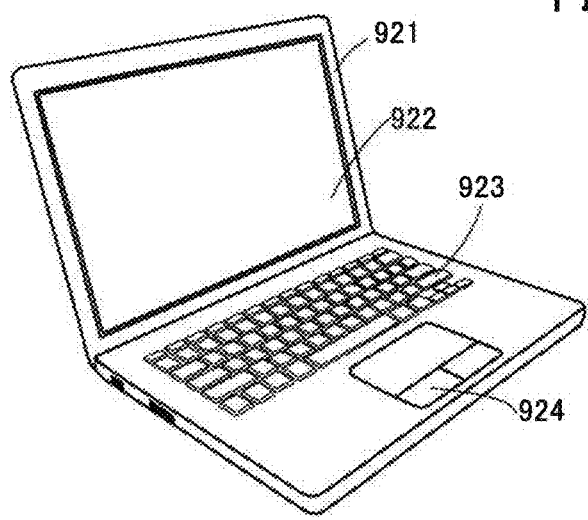

FIG. 48C illustrates a notebook personal computer, which includes a housing 921, a display portion 922, a keyboard 923, a pointing device 924, and the like.

Figure 48D:
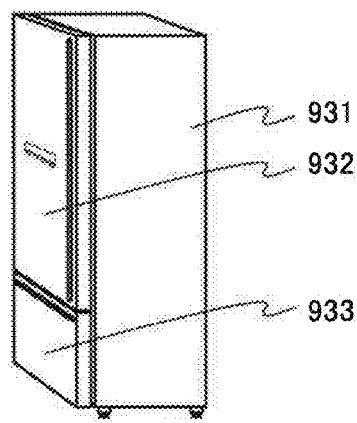

FIG. 48D illustrates an electric refrigerator-freezer, which includes a housing 931, a door for a refrigerator 932, a door for a freezer 933, and the like.

Figure 48E:
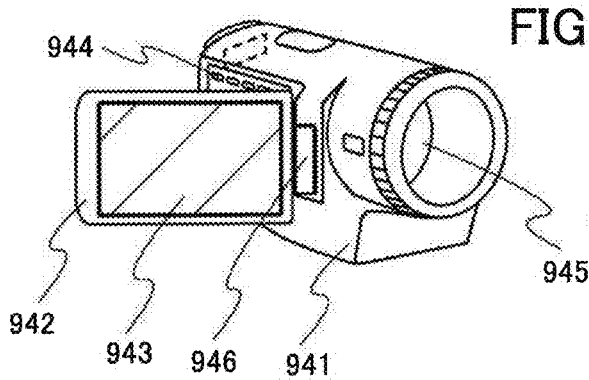

FIG. 48E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 48F:
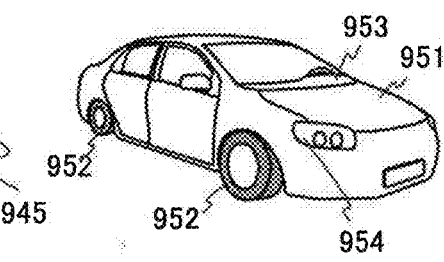

FIG. 48F illustrates a car including a car body 951, wheels 952, a dashboard 953, lights 954, and the like.

The structures described in this embodiment can be used in appropriate combination with any of the structures described in the other embodiments.

Embodiments of the present invention have been described in the above embodiments. Note that one embodiment of the present invention is not limited thereto. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

This application is based on Japanese Patent Application serial no. 2015-066832 filed with Japan Patent Office on Mar. 27, 2015, the entire contents of which are hereby incorporated by reference.

What is claimed is:

1. A semiconductor device comprising:
a first insulator comprising an opening;
a first conductor in the opening of the first insulator;
a second insulator over the first conductor;
an oxide semiconductor over the second insulator;
a third insulator over the oxide semiconductor; and
a second conductor over the third insulator,
wherein a side surface of the third insulator is in contact with the second insulator,
wherein the oxide semiconductor comprises a first region overlapped with the second conductor,
wherein the first conductor is in contact with the second conductor, and
wherein the first region in the oxide semiconductor is surrounded in four directions of the first region except for a channel length direction by the first conductor and the second conductor with the second insulator and the third insulator interposed therebetween.

2. The semiconductor device according to claim 1,
wherein the oxide semiconductor further comprises a second region and a third region,
wherein the first region is between the second region and the third region, and
wherein each of the second region and the third region has lower resistance than the first region.

3. The semiconductor device according to claim 1,
wherein the oxide semiconductor further comprises a second region and a third region,
wherein the first region is between the second region and the third region, and
wherein an impurity concentration is higher in each of the second region and the third region than in the first region.

4. The semiconductor device according to claim 1,
wherein the second insulator comprises silicon, and the third insulator comprises hafnium.

5. The semiconductor device according to claim 1,
wherein a thickness of the second insulator is different from a thickness of the third insulator.

6. An electronic device comprising the semiconductor device according to claim 1.

7. A semiconductor device comprising:
a first insulator comprising an opening;
a first conductor in the opening of the first insulator;
a second insulator over the first conductor;
an oxide semiconductor over the second insulator;
a third insulator over the oxide semiconductor; and
a second conductor over the third insulator,
wherein a side surface of the third insulator is in contact with the second insulator,
wherein the second insulator, the third insulator, and the oxide semiconductor are in the opening of the first insulator,
wherein the first conductor is in contact with the second conductor, and
wherein a first region in the oxide semiconductor is surrounded in four directions of the first region except for a channel length direction by the first conductor and the second conductor with the second insulator and the third insulator interposed therebetween.

8. The semiconductor device according to claim 7,
wherein the oxide semiconductor further comprises a second region and a third region,
wherein the first region is between the second region and the third region, and
wherein each of the second region and the third region has lower resistance than the first region.

9. The semiconductor device according to claim 7,
wherein the oxide semiconductor further comprises a second region and a third region,
wherein the first region is between the second region and the third region, and
wherein an impurity concentration is higher in each of the second region and the third region than in the first region.

10. The semiconductor device according to claim 7,
wherein the second insulator comprises silicon, and the third insulator comprises hafnium.

11. The semiconductor device according to claim 7,
wherein a thickness of the second insulator is different from a thickness of the third insulator.

12. An electronic device comprising the semiconductor device according to claim 7.

13. A semiconductor device comprising:
a first insulator comprising an opening;
a first conductor in the opening of the first insulator;
a second insulator over the first insulator and the first conductor;
an oxide semiconductor over the second insulator;
a third insulator over the oxide semiconductor; and
a second conductor over the third insulator,
wherein a side surface of the third insulator is in contact with the second insulator,
wherein the oxide semiconductor comprises a first region overlapped with the second conductor,
wherein the first conductor is in contact with the second conductor, and
wherein the first region in the oxide semiconductor is surrounded in four directions of the first region except for a channel length direction by the first conductor and the second conductor with the second insulator and the third insulator interposed therebetween.

14. The semiconductor device according to claim 13,
wherein the oxide semiconductor further comprises a second region and a third region,
wherein the first region is between the second region and the third region, and
wherein each of the second region and the third region has lower resistance than the first region.

15. The semiconductor device according to claim 13,
wherein the oxide semiconductor further comprises a second region and a third region,
wherein the first region is between the second region and the third region, and
wherein an impurity concentration is higher in each of the second region and the third region than in the first region.

16. The semiconductor device according to claim 13,
wherein the second insulator comprises silicon, and the third insulator comprises hafnium.

17. The semiconductor device according to claim 13,
wherein a thickness of the second insulator is different from a thickness of the third insulator.

18. An electronic device comprising the semiconductor device according to claim 13.

* * * * *